US012698202B2

(12) United States Patent
Hong et al.

(10) Patent No.: US 12,698,202 B2
(45) Date of Patent: Aug. 4, 2026

(54) CROSSOVERS FOR VACUUM PACKAGING

(71) Applicant: Obsidian Sensors, Inc., San Diego, CA (US)

(72) Inventors: John Hong, San Diego, CA (US); Tallis Chang, San Diego, CA (US); Sean Andrews, San Diego, CA (US); Jan Bos, Hsinchu (TW); Jia-Wei Ma, Taipei City (TW)

(73) Assignee: Obsidian Sensors, Inc., San Diego, CA (US)

( * ) Notice: Subject to any disclaimer, the term of this patent is extended or adjusted under 35 U.S.C. 154(b) by 747 days.

(21) Appl. No.: 17/801,230

(22) PCT Filed: Feb. 19, 2021

(86) PCT No.: PCT/US2021/018848
§ 371 (c)(1),
(2) Date: Aug. 19, 2022

(87) PCT Pub. No.: WO2021/168299
PCT Pub. Date: Aug. 26, 2021

(65) Prior Publication Data
US 2022/0411261 A1 Dec. 29, 2022

Related U.S. Application Data

(60) Provisional application No. 63/002,229, filed on Mar. 30, 2020, provisional application No. 62/980,096, filed on Feb. 21, 2020.

(51) Int. Cl.
*B81C 1/00* (2006.01)
*B81B 7/00* (2006.01)

(52) U.S. Cl.
CPC ........ *B81C 1/00095* (2013.01); *B81B 7/0029* (2013.01); *B81B 7/007* (2013.01); *B81B 2201/0207* (2013.01); *B81B 2207/097* (2013.01)

(58) Field of Classification Search
CPC ............... B81C 1/00095; B81B 7/007; B81B 2207/097; B81B 2207/07
See application file for complete search history.

(56) References Cited

U.S. PATENT DOCUMENTS

| | | |
|---|---|---|
| 4,023,562 A | 5/1977 | Hynecek et al. |
| 2002/0008317 A1 | 1/2002 | Engelhardt et al. |

(Continued)

FOREIGN PATENT DOCUMENTS

| | | |
|---|---|---|
| JP | 2001-177112 A | 6/2001 |
| KR | 10-2014-0104472 A | 8/2014 |

(Continued)

*Primary Examiner* — Moazzam Hossain
(74) *Attorney, Agent, or Firm* — Procopio, Cory, Hargreaves & Savitch LLP

(57) ABSTRACT

In some embodiments, electromechanical systems including a semiconductor layer that has a planar surface and includes conductive and adjacent non-conductive regions and a hermetic seal applied above the planar surface and methods of manufacturing the systems are disclosed. In some embodiments, electromechanical devices that include first and second planar semiconductor layers are disclosed. Each of the semiconductor layers includes conductive regions, and at least one conductive region from each of the layers is electrically coupled to each other. Methods of manufacturing the electromechanical devices are also disclosed.

17 Claims, 17 Drawing Sheets

(56)             References Cited

U.S. PATENT DOCUMENTS

| | | | | |
|---|---|---|---|---|
| 2003/0038327 A1* | 2/2003 | Smith | ..................... | B81B 7/007 |
| | | | | 257/415 |
| 2008/0017925 A1* | 1/2008 | Yamaguchi | ......... | B81C 1/00246 |
| | | | | 257/53 |
| 2010/0197063 A1* | 8/2010 | Bluzer | ................... | H10F 30/00 |
| | | | | 438/51 |
| 2011/0239772 A1* | 10/2011 | Kurtz | ................... | G01L 9/0055 |
| | | | | 29/592.1 |
| 2012/0119311 A1 | 5/2012 | Esfahany et al. | | |
| 2016/0141320 A1* | 5/2016 | Tu | ......................... | H10F 39/804 |
| | | | | 257/432 |
| 2018/0215610 A1 | 8/2018 | Favier et al. | | |

FOREIGN PATENT DOCUMENTS

| | | | |
|---|---|---|---|
| TW | 201731136 | A | 9/2017 |
| WO | 2007021396 | A2 | 2/2007 |
| WO | 2019141908 | A1 | 7/2019 |
| WO | 2019178402 | A1 | 9/2019 |

* cited by examiner

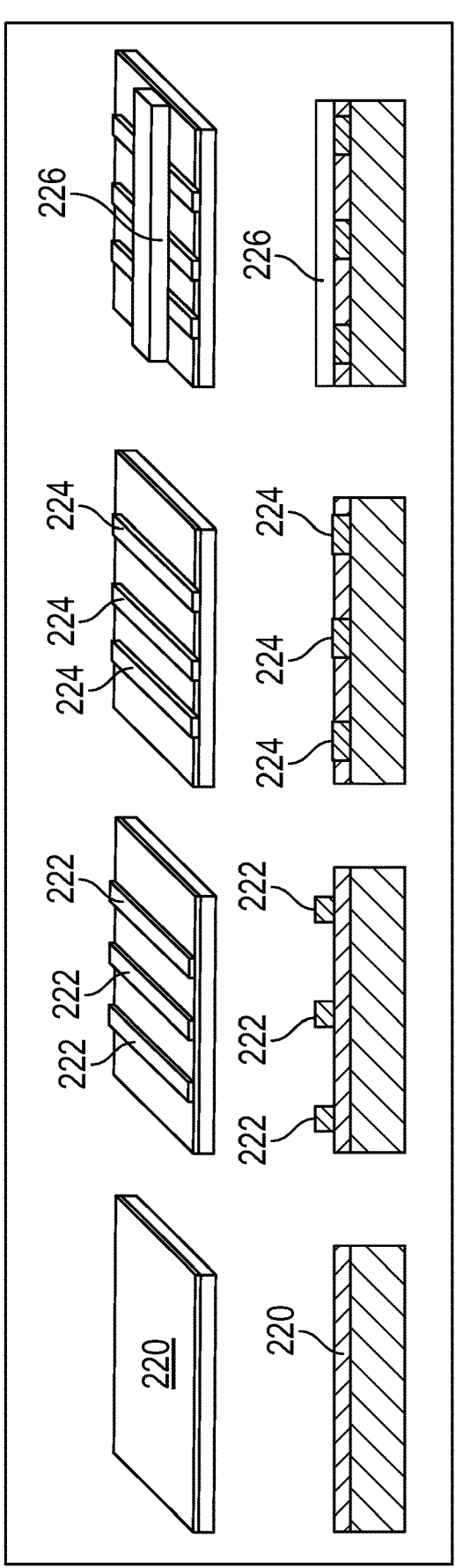
FIG. 2C
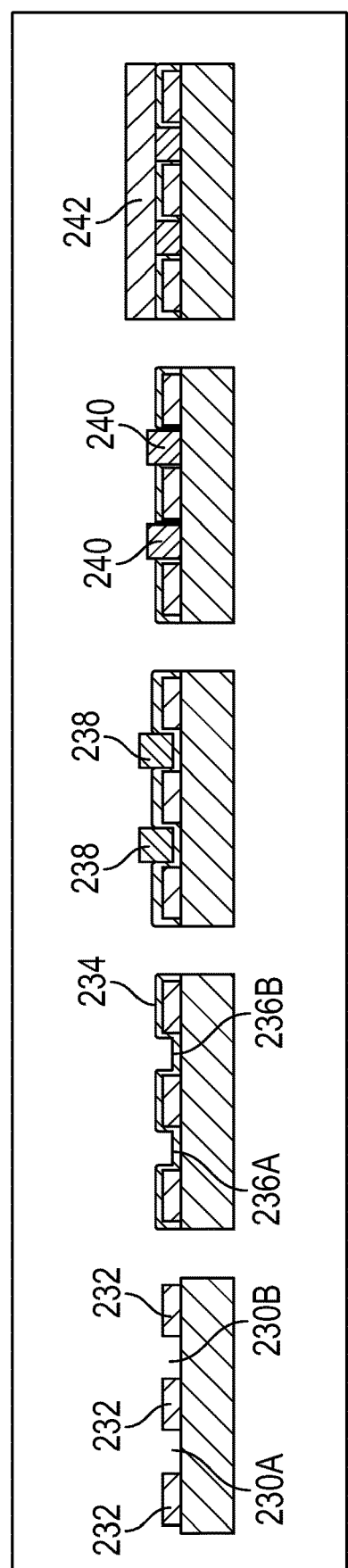
FIG. 2D

300

302

Provide a semiconductor layer having a planar surface

304

Create conductive regions in the semiconductor layer

306

Apply a seal

502

500

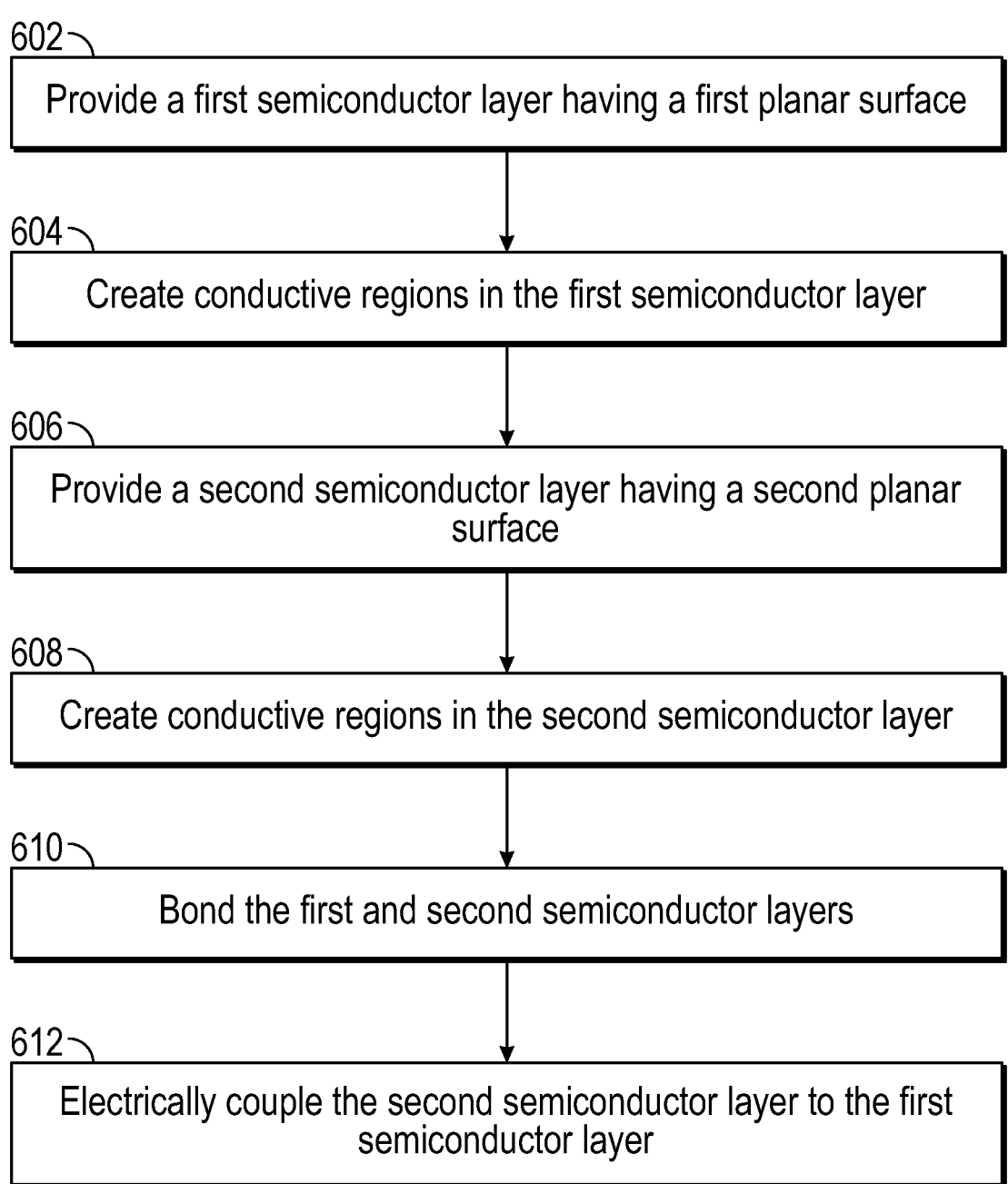

600

602
Provide a first semiconductor layer having a first planar surface

604
Create conductive regions in the first semiconductor layer

606
Provide a second semiconductor layer having a second planar surface

608
Create conductive regions in the second semiconductor layer

610
Bond the first and second semiconductor layers

612
Electrically couple the second semiconductor layer to the first semiconductor layer

752
Provide a first portion of a device with a bond region

754
Add features on the surface of the first portion in the bond region

756
Deposit an interfacial layer on the features

758
Position a second portion of the device over the bond region

760
Bond the first and second portions of the device at the bond region

CROSSOVERS FOR VACUUM PACKAGING

CROSS REFERENCE TO RELATED APPLICATIONS

This application is a national stage application under 35 U.S.C. § 371 of International Application No. PCT/US2021/018848, filed internationally on Feb. 19, 2021, which claims benefit of U.S. Provisional Application No. 62/980,096, filed Feb. 21, 2020, and U.S. Provisional Application No. 63/002,229, filed Mar. 30, 2020, the contents of each are incorporated herein by reference in their entirety.

FIELD OF INVENTION

This disclosure generally relates to electronic packaging. More specifically, this disclosure relates to vacuum packaging over conductive crossovers.

BACKGROUND OF THE INVENTION

MEMS devices may operate in a vacuum. For example, a bolometer array may operate in a vacuum to ensure longevity and accuracy of the device.

Vacuum packaging technologies, such as hermetic sealing, generally require a planar surface topography in the seal area. A hermetic seal is an air tight seal that keeps gases and liquids from entering or exiting a volume. Generally, in hermetic sealing, a flat interface is more desirable than a non-flat interface (e.g., protrusions at the interface) because a non-flat interface may result in a degraded seal. In some instances, a degraded seal can reduce an effectiveness of a vacuum and lower performance and longevity of a device (e.g., a bolometer).

In some applications, patterned conductive traces may be required to cross the seal area (e.g., crossovers). For example, patterned conductive traces can create power and signal routings for a bolometer array located inside a vacuum. Patterning of the traces may require removal of the conductive material between adjacent traces, leading to a non-planar surface. This non-planar topography is undesirable for hermetic seal processes because, for example, depositing a seal ring on top of such a topography can cause undesired protrusions in the seal ring and degradation to sealing properties (e.g., bonding). To address seal degradation, additional material can be added between adjacent traces, but this adds production cost. Further, the added material does not create a planar topography, and additional processing steps (such as chemical-mechanical planarization or chemical-mechanical polishing (CMP)) are required to create a planar topography.

Bonding conductive layers in an integrated circuit may require either an additional metallic or dielectric material in each of the bonded layers. In some applications, each of the bonded layers requires a planar surface at the bonding interface to ensure a good bond. Planarization techniques such as CMP are used to create flat surfaces on the metallic or dielectric material and create the planar surfaces. As mentioned, planarization can be costly (and in some instances, may be impossible) as the planar surface area increases. Therefore, bonding techniques that do not require planarization may be desired.

SUMMARY OF THE INVENTION

Examples of the disclosure include methods of forming conductive crossovers in a planar seal area and devices created by these methods. In the exemplary methods, material removal between adjacent traces in the crossovers can be forgone, allowing the topography to retain a shape suitable for sealing or reducing the need for additional material (and processing) to create a planar topography.

In some embodiments, a method for manufacturing electromechanical systems includes: providing a semiconductor layer having a planar surface; creating conductive regions and adjacent non-conductive regions in the semiconductor layer by modifying a composition of the semiconductor layer, wherein the planar surface comprises surfaces of the conductive regions and the non-conductive regions; and applying a hermetic seal above the planar surface to create a hermetically sealed volume, wherein: a conductive region of the conductive regions comprises a first part and a second part, the first part of the conductive region is below the hermetically sealed volume, and the second part of the conductive region is not below the hermetically sealed volume.

In some embodiments, creating the conductive regions in the semiconductor layer comprises doping regions of the semiconductor layer to create conductive regions.

In some embodiments, doping the regions of the semiconductor layer further comprises N-type doping the regions.

In some embodiments, the method further includes P-type doping regions of the semiconductor layer to create the non-conductive regions.

In some embodiments, the hermetically sealed volume is a vacuum.

In some embodiments, the conductive regions are created without changing a topography of the semiconductor layer.

In some embodiments, creating the conductive regions in the semiconductor layer comprises forming a silicide in regions of the semiconductor layer to create conductive regions.

In some embodiments, forming the silicide further comprises depositing patterned metal on top of the semiconductor layer.

In some embodiments, a surface of the semiconductor layer spans dimensions greater than 620 mm by 750 mm.

In some embodiments, the non-conductive regions in the semiconductor layer comprise undoped semiconductor.

In some embodiments, the conductive regions are created without removing material from the semiconductor layer.

In some embodiments, the method further includes electrically coupling a via to the conductive region.

In some embodiments, the method further includes electrically coupling the conductive region to a bolometer circuit.

In some embodiments, providing a semiconductor layer having the planar surface comprises depositing the semiconductor layer on a glass substrate.

In some embodiments, the method further includes providing an insulating layer above the semiconductor layer and below the hermetic seal.

In some embodiments, the method includes oxidizing the non-conductive regions.

In some embodiments, the method further includes separating the semiconductor layer into a plurality of separated portions, wherein applying the hermetic seal further comprises applying a hermetic seal on top of a separated portion.

In some embodiments, an electromechanical system includes: a semiconductor layer having a planar surface, wherein the semiconductor layer comprises conductive regions and adjacent non-conductive regions, wherein the conductive regions comprise a modified material and adjacent non-conductive regions comprise the material, and a hermetic seal applied above the planar surface, wherein the hermetic seal creates a hermetically sealed volume, wherein: a conductive region of the conductive regions comprises a first part and a second part, the first part of the conductive region is below the hermetically sealed volume, and the second part of the conductive region is not below the hermetically sealed volume.

In some embodiments, the conductive regions of the semiconductor layer are doped.

In some embodiments, the conductive regions comprise N-type dopants.

In some embodiments, the non-conductive regions comprise P-type dopants.

In some embodiments, the conductive regions are created without changing a topography of the semiconductor layer.

In some embodiments, the conductive regions comprise a silicide.

In some embodiments, the silicide is formed by depositing patterned metal on top of the semiconductor layer.

In some embodiments, a surface of the semiconductor layer spans dimensions greater than 620 mm by 750 mm.

In some embodiments, the non-conductive regions in the semiconductor layer comprise undoped semiconductor.

In some embodiments, the conductive regions are created without removing material from the semiconductor layer.

In some embodiments, the system further includes a via electrically coupled to the conductive region.

In some embodiments, at least one of the conductive regions is electrically coupled to a bolometer circuit.

In some embodiments, the system further includes a glass substrate, wherein the semiconductor layer is deposited on the glass substrate.

In some embodiments, the system further includes an insulating layer above the semiconductor layer and below the hermetic seal.

In some embodiments, the non-conductive regions are oxidized.

In some embodiments, the non-conductive regions are modified differently than the modification of the conductive regions.

Examples of the disclosure include methods of bonding two planar semiconductor layers and devices created by these methods. In the exemplary methods, planarization steps can be forgone prior to bonding.

In some embodiments, a method for manufacturing electromechanical systems, comprises: providing a first semiconductor layer having a first planar surface; creating conductive regions and adjacent non-conductive regions in the first semiconductor layer by modifying a composition of the first semiconductor layer; providing a second semiconductor layer having a second planar surface; creating conductive regions and adjacent non-conductive regions in the second semiconductor layer by modifying a composition of the second semiconductor layer; bonding the first and second semiconductor layers, wherein the second planar surface is parallel to the first planar surface, and electrically coupling the second semiconductor layer to the first semiconductor layer.

In some embodiments, creating the conductive regions in the first and second semiconductor layers comprises doping regions of the semiconductor layers to create conductive regions.

In some embodiments, doping the regions of the semiconductor layers further comprises N-type doping the regions.

In some embodiments, the method further comprises P-type doping regions of the semiconductor layers to create the non-conductive regions.

In some embodiments, the conductive regions are created without changing a topography of the semiconductor layers.

In some embodiments, creating the conductive regions in the semiconductor layers comprises forming a silicide in regions of the semiconductor layers to create conductive regions.

In some embodiments, the non-conductive regions in the semiconductor layers comprise undoped semiconductor.

In some embodiments, the conductive regions are created without removing material from the semiconductor layers.

In some embodiments, the method further comprises surface treating the first and second planar surfaces.

In some embodiments, the method further comprises activating the surface-treated planar surfaces prior to bonding the first and second semiconductor layers.

In some embodiments, electrically coupling the second semiconductor layer to the first semiconductor layer comprises electrically coupling a conductive region of the second semiconductor layer to a conductive region of the first semiconductor layer.

In some embodiments, the method further comprises electrically coupling a second conductive region of the conductive regions of the first semiconductor layer to a second conductive region of the conductive regions of the second semiconductor layer, wherein the second conductive regions are electrically uncoupled from the first conductive regions.

In some embodiments, the electrically coupled conductive regions form signal lines.

In some embodiments, the method further comprises oxidizing the non-conductive regions.

In some embodiments, the method further comprises separating the bonded semiconductor layers into a plurality of separated portions, each separate portion associated with an electromechanical system.

In some embodiments, the first and second planar surfaces have a root mean square roughness of less than 1 nm.

In some embodiments, an electromechanical system comprises: a first semiconductor layer having a first planar surface, wherein the first semiconductor layer comprises conductive regions and adjacent non-conductive regions, wherein the conductive regions comprise a first modified material and adjacent non-conductive regions comprise the first material; and a second planar semiconductor layer having a second planar surface, wherein the second semiconductor layer comprises conductive regions and adjacent non-conductive regions, wherein the conductive regions comprise a second modified material and adjacent non-conductive regions comprise the second material, wherein: the first planar surface is parallel to the second planar surface, and a conductive region of the first semiconductor layer electrically couples to a conductive region of the second semiconductor layer.

In some embodiments, the conductive regions of the first and second semiconductor layers are doped.

In some embodiments, the conductive regions comprise N-type dopants.

In some embodiments, the non-conductive regions comprise P-type dopants.

In some embodiments, the conductive regions are created without changing a topography of the semiconductor layers.

In some embodiments, the conductive regions comprise a silicide.

In some embodiments, the non-conductive regions in the semiconductor layer comprise undoped semiconductor.

In some embodiments, the conductive regions are created without removing material from the semiconductor layers.

In some embodiments, the first and second planar semiconductor layers are surface-treated.

In some embodiments, a conductive region of the second semiconductor layer is electrically coupled to a conductive region of the first semiconductor layer.

In some embodiments, a second conductive region of the conductive regions of the first semiconductor layer is electrically coupled to a second conductive region of the conductive regions of the second semiconductor layer, and the second conductive regions are electrically uncoupled from the first conductive regions.

In some embodiments, the electrically coupled conductive regions are signal lines.

In some embodiments, the non-conductive regions are oxidized.

In some embodiments, the first and second planar surfaces have a root mean square roughness of less than 1 nm.

Examples of the disclosure include a method of bonding a first and a second portion of an electromechanical device. In the exemplary methods, compared to bonding without the disclosed features, the strength and/or uniformity of the bond may be improved.

In some embodiments, a method of manufacturing an electromechanical device, includes: providing a first portion of a device with a bond region; adding features on the surface of the first portion in the bond region; depositing an interfacial layer on the features; positioning a second portion of the device over the bond region; and bonding the first and second portions of the device at the bond region.

In some embodiments, the method includes depositing an insulating layer between the features and the interfacial layer.

In some embodiments, the first portion includes a non-silicon material.

In some embodiments, the features include a conductive material.

BRIEF DESCRIPTION OF THE DRAWINGS

FIG. 2C illustrates an embodiment of the conductive crossovers.

FIG. 2D illustrates an embodiment of the conductive crossovers.

FIG. 6 illustrates a method of manufacturing an electromechanical device that includes two bonded planar semiconductor layers according to examples of the disclosure.

DETAILED DESCRIPTION OF EXEMPLARY EMBODIMENTS

In the following description of embodiments, reference is made to the accompanying drawings which form a part hereof, and in which it is shown by way of illustration specific embodiments which can be practiced. It is to be understood that other embodiments can be used and structural changes can be made without departing from the scope of the disclosed embodiments.

Examples of the disclosure include methods of forming conductive crossovers in a planar seal area and devices created by these methods. In the exemplary methods, material removal between adjacent traces in the crossovers can be forgone, allowing the topography to retain a shape suitable for sealing or reducing the need for additional material (and processing) to create a planar topography.

Figure 1A:
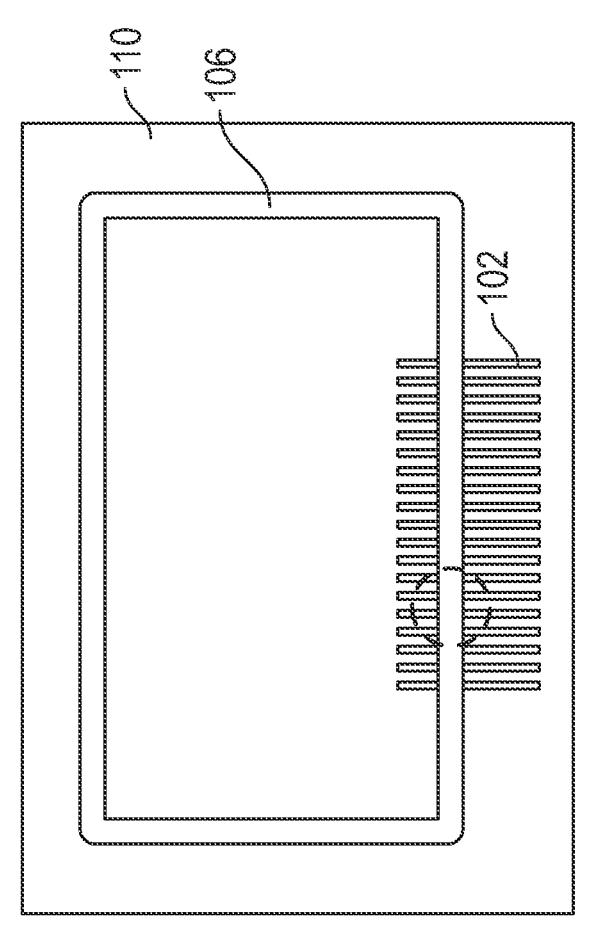
FIG. 1A illustrates a top view of conductive crossovers in a seal region of a device.

FIG. 1A illustrates a top view of conductive crossovers in a seal region of a semiconductor device. The illustrated stackup includes conductive crossovers 102, insulating layer 104 (see FIG. 1B), and seal metal ring 106. The stackup is deposited over a substrate 110. For clarity and better illustration of the conductive crossovers, some details (e.g., insulating layer 104) of the stackup are not shown in FIG. 1A.

Figure 1B:
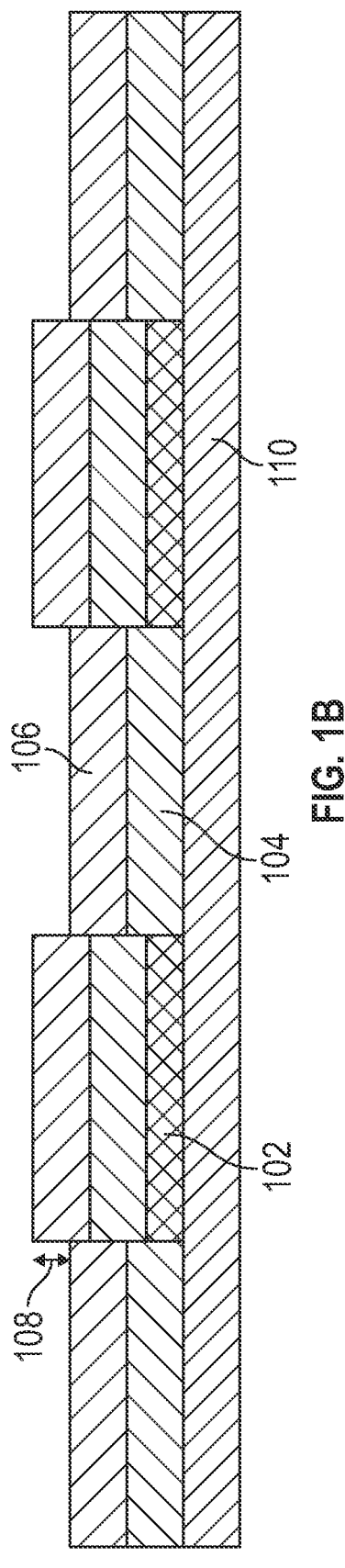
FIG. 1B illustrates a cross sectional view of conductive crossovers in a seal region of the device shown in FIG. 1A.

FIG. 1B illustrates a cross sectional view of a stack-up in a seal region, for example, of an area of a device indicated by the dashed circle in FIG. 1A. The illustrated stackup includes conductive crossovers 102, insulating layer 104, and seal metal ring 106. The seal metal ring 106 includes protrusions 108.

In some instances, conductive crossovers 102 are created by depositing a metal layer above a substrate 110 before the deposition of the insulating layer 104 and application of seal metal ring 106. After the metal layer is deposited, the crossovers 102 are patterned by removing conductive material between adjacent traces. After the conductive material is removed, the insulator 104 is deposited above the crossovers 102, and the seal metal ring 106 is deposited above the insulator 104. Depositing a seal ring on top of such a topography can cause protrusions 108 in the seal ring. In some instances, the steps can cause degradation to sealing properties.

Alternatively, additional material can be added between adjacent traces to create a planar topography such that the protrusions 108 can be eliminated (e.g., the insulator and the seal ring are planar). In these instances, the additional material cannot be merely added to create a planar topography. Further processing steps such as chemical-mechanical planarization or CMP are required to create a planar topography. However, adding material and processing steps can add to production costs.

Figure 2A:
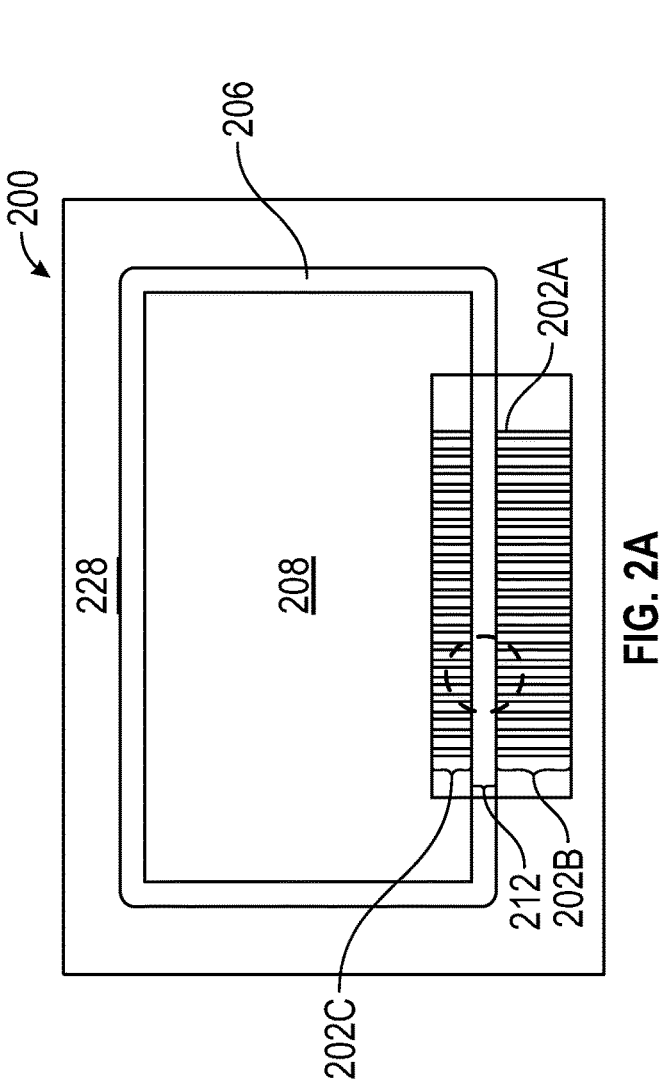
FIG. 2A illustrates a top view of conductive crossovers in a seal region of a device having a planar topography according to examples of the disclosure.

FIG. 2A illustrates a top view of conductive crossovers in a seal region of an electromechanical device 200 having a planar topography according to examples of the disclosure. The seal region may be part of a device, for example, a thermal imaging device. In some embodiments, the device is a bolometer. In some embodiments, the device includes a glass substrate and the illustrated stackup is deposited on the glass substrate (e.g., LCD glass substrate). For example, the device includes a bolometer array and peripheral circuitries. In some instances, the glass substrate is a generation 3.5 glass substrate having dimensions of 620 mm by 750 mm.

In some embodiments, a packaging step is performed prior to placement of the sensor onto the device (e.g., at the bolometer level). In some embodiments, the packaging step is performed after the sensor is placed on the device.

The illustrated stackup includes conductive crossovers 202A, insulating layer 204 (see FIG. 2B), and seal metal ring 206. The stackup is deposited over a substrate 210. In some embodiments, a seal interface region has a length 212, which is a length of the interface between the seal and the crossover region. For clarity and better illustration of the conductive crossovers, some details (e.g., insulating layer 204) of the stackup is not shown in FIG. 2A.

In some embodiments, the seal metal ring 206 encloses a vacuum region 208. For example, the vacuum region is hermetically sealed, and the seal metal ring 206 serves as a hermetic seal. In some embodiments, the vacuum region 208 is a hermetic seal volume created by the hermetic seal above the crossovers. In some embodiments, a non-vacuum region 228 is outside the vacuum region. For example, the non-vacuum region is not below the hermetic seal volume. That is, a first portion of the semiconductor layer (e.g., a first portion of a conductive region) may be inside the vacuum region, and a second portion of the semiconductor layer (e.g., a second portion of the conductive region) may be outside the hermetic seal volume. In some embodiments, the hermetic seal is a non-conducting seal.

Figure 2B:
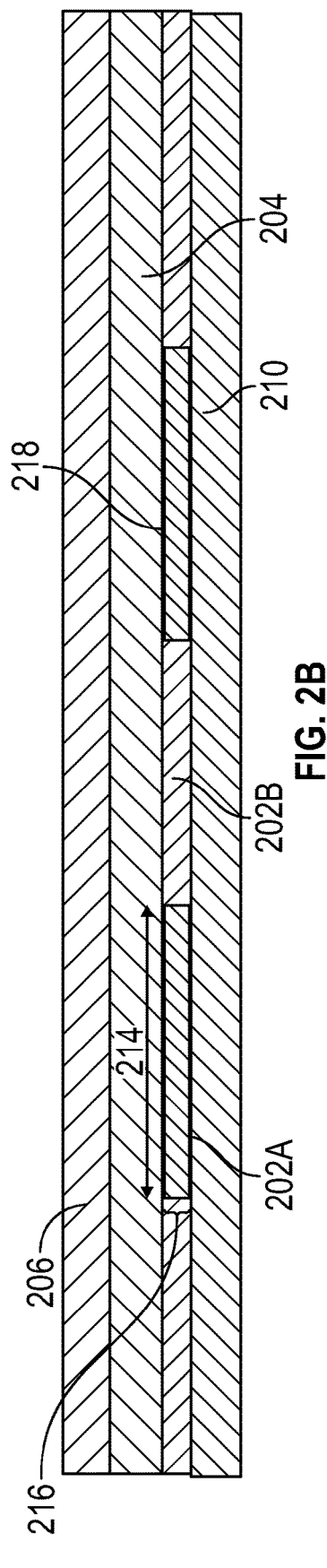
FIG. 2B illustrates a cross sectional view of conductive crossovers in a seal region of the device shown in FIG. 2A.

FIG. 2B illustrates a cross sectional view of conductive crossovers in a seal region (for example, the area indicated by the dashed circle in FIG. 2A) having a planar topography according to examples of the disclosure. In this example, the seal region is an interface between vacuum and non-vacuum regions. In some embodiments, a surface below the seal metal ring in the seal region is planar. In some embodiments, the conductive crossovers have a width 214 and a height 216.

In some embodiments, at least one of the conductive crossovers 202A includes a portion in the vacuum region and a portion in the non-vacuum region. The conductive crossover is routed from the non-vacuum region to the vacuum region by traversing the seal region.

The illustrated stackup includes conductive crossovers 202A, non-conductive regions 202B, insulating layer 204, and seal metal ring 206. In some embodiments, the layers are planar such that the aforementioned steps do not substantially degrade characteristics of the device (e.g., sealing properties).

In some embodiments, the conductive crossovers 202A are in conductive regions of the semiconductor layer and the non-conductive regions 202B are adjacent non-conductive regions of the semiconductor layer. In some examples, the conductive regions comprises a modified material (e.g., doped N-type semiconductor, silicide) and the non-conductive region comprises the material (e.g., doped P-type semiconductor, undoped semiconductor). As used herein, if a region includes a material and the region is modified by doping or silicide formation, the region still includes the material.

In some embodiments, the semiconductor layer of the stackup includes a planar surface 218 and the planar surface comprises surfaces of the conductive crossovers 202A and the non-conductive regions 202B. In some embodiments, the conductive regions includes a first part (e.g., first part 202B, as illustrated in FIG. 2A) below a hermetically sealed volume (e.g., vacuum region 208) and a second part (e.g., second part 202C, as illustrated in FIG. 2B) not below the hermetically sealed volume (e.g., non-vacuum region 228).

As an example, the length 212 of the seal interface region can be approximately 100 μm. If the conductive crossovers are straight and perpendicular to the seal interface, then the conductive crossovers would have a length of approximately 100 μm. In some examples, the width 214 of each conductive crossover can be approximately 20 μm and each conductive crossover is approximately 20 μm apart from each other. The semiconductor layer can have a height 216 of approximately 200 nm.

The conductive crossovers described and illustrated herein are not limiting, unless otherwise stated. It is understood that the conductive crossovers can have spacings, dimensions, and properties different than the described embodiments.

In some embodiments, a layer that includes the conductive crossovers 202A and non-conductive regions 202B is a planar semiconductor layer. In some embodiments, the conductive crossovers 202A are created by modifying a composition of the planar surface of the semiconductor layer to be conductive. For example, prior to modifying its composition, the planar semiconductor layer is an amorphous silicon layer. In some embodiments, the composition of the semiconductor layer below the planar surface is also modified to be conductive. In some embodiments, modifying a composition of a layer (e.g., the semiconductor layer) does not include removal of material in the layer being modified and then adding another material in its place. For example, the semiconductor layer is doped. As another example, silicide is formed from the semiconductor layer.

In some embodiments, prior to separation, a semiconductor layer used to create the conductive crossovers spans dimensions greater than 620 mm by 750 mm. For example, prior to singulation, the semiconductor layer is deposited above a generation 3.5 glass substrate having dimensions of 620 mm by 750 mm; the semiconductor layer includes a plurality of semiconductor portions arranged in an array, each portion corresponding to a single device. The semiconductor layer can be continuous or discontinuous (e.g., the layer includes breaks or gaps between adjacent portions). In some instances, prior to singulation, the dimensions of the semiconductor layer maybe too large for planarization to be cost-effective (e.g., chemical-mechanical planarization, CMP). Therefore, embodiments described herein may advantageously create a planar semiconductor layer that includes a crossover(s) without planarization. In some embodiments, after formation of devices coupled to the semiconductor layer (e.g., bolometers), the stack up of glass substrate, semiconductor layer, and devices may be separated into smaller portions (e.g., wafer size portions) for hermetic sealing.

In some embodiments, since the semiconductor layer is planar (e.g., protrusions are not created during formation of the conductive crossovers), planarization (e.g., chemical-mechanical planarization) of the semiconductor layer is not required. As an exemplary advantage, complexity and cost of manufacturing the device can be reduced because planarization steps are no longer required. In some instances, creating the conductive crossovers with a semiconductor layer (e.g., without metal deposition) may be sufficient to meet electrical requirements (e.g., delay, noise, voltage drop) of the device. Therefore, in these instances, the cost and complexity of the device can be kept lower because device requirements can be met without the need to planarize. In those instances where planarization is not a viable alternative (for example, on a plate level processing scale), embodiments disclosed herein can facilitate processing by eliminating a planarization step.

In some embodiments, the conductive crossovers 202A are created by doping specific regions of the planar semiconductor layer. For example, the specific regions are patterns of the conductive crossovers. In some embodiments, the specific regions of the planar semiconductor layer are doped with N-type dopants.

In some embodiments, the non-conductive region 202B is less electrically conductive compared to the conductive crossovers 202A. In some embodiments, the non-conductive regions 202B include undoped silicon while the conductive crossovers 202A include a more conductive material (e.g., doped silicon, silicide). In some embodiments, the non-conductive regions 202B are doped with P-type dopants. In some embodiments, the non-conductive regions 202B are oxidized. In some embodiments, the resistivity of the non-conductive regions is approximately $10^{12}$ ohm-cm.

For example, amorphous silicon can be doped by precursor gas phase doping in a chemical vapor deposition (CVD) chamber or by implantation. The N-type dopant can be phosphorous or arsenic. In gas phase, phosphorous can correspond to phosphine ($PH_3$), and arsenic can correspond to Arsine ($AsH_3$). The P-type dopant can be boron, which can correspond to diborane ($B_2H_6$) in gas phase.

As an example, a lower resistivity of approximately 10 milliohm-cm can be achieved for a microcrystalline silicon in a gas phase at doping ratio of approximately 0.1 ($PH_3$/ $SiH_4$). A lower conductivity can be achieved by lightly doping P-type at an approximately $10^{-5}$ gas phase ratio ($B_2H_6$/$SiH_4$).

In some embodiments, the conductive crossovers include a silicide. For example, the conductive crossovers are silicide feedthroughs within an amorphous silicon layer.

In some embodiments, the silicide is formed by patterned deposition of metal onto an amorphous silicon layer. Non-limiting examples of silicide formation are described in WO 2019/178402, the entire contents of which are incorporated herein by reference for all purposes. The pattern corresponds to locations of the feedthroughs or crossovers. For example, the patterned metals are deposited on top of an amorphous silicon layer. The patterned metals and the amorphous silicon can react by annealing. Upon annealing, the patterned metal diffuses with the silicon and forms silicide. The formation of the silicide causes an overall volume reduction compared to the combined volumes of the patterned metals and silicon before diffusion. Given dimensions (e.g., width, height, thickness) and mass of the patterned metals and amorphous silicon, the dimensions of the formed silicide and conductive crossovers can be derived based on the patterned metals, and a silicide crossover having desired dimensions can be created using patterned metal having appropriate dimensions and mass.

In some embodiments, the silicide is formed laterally. An insulating layer is located below the amorphous silicon layer. In some embodiments, the insulating layer bounds silicide formation in a lateral direction (i.e., direction parallel to the insulating layer). Given dimensions and mass of the patterned metals, if the insulating layer bounds silicide formation to the lateral direction, then the lateral dimensions (e.g., width) of the silicide crossovers can be derived. Therefore, a silicide crossover having a desired width can be created using patterned metal having appropriate dimensions and mass.

For example, as illustrated in FIG. 2C, patterned metals 222 are deposited on top of an amorphous silicon layer 220.

Using any of the described methods (e.g., using patterned metals having the appropriate dimensions and mass to create desired crossover dimensions), silicide conductive crossovers 224 are formed. After the conductive crossovers are formed, a seal 226 can be deposited over the silicon layer and conductive crossovers using any of the described methods.

In some embodiments, although the formation of silicide can cause an offset in thickness compared to an adjacent amorphous silicon portion, the offset may be small enough to allow for bonding to occur without the need for planarization (e.g., the offset is significantly smaller than the steps). In some embodiments, the offsets have an RMS value of less than 40 nm, which may be sufficient to maintain a pressure difference of $15 \times 10^3$ atm between an environment surrounding the seal and a volume within the seal. Therefore, in some embodiments, depending on device requirements, it may be advantageous to form the crossovers with silicide to reduce resistivity. For example, resistivity of the NiSi is approximately 4 μohm-cm. As another example, $Ni_2Si$ has a resistivity of approximately 24 μohm-cm.

FIG. 2D illustrates an embodiment of the conductive crossovers. In some embodiments, the silicide crossovers can be formed without an offset. The silicide crossovers can be formed by initially creating patterned first trenches 230 above an insulating layer (e.g., glass substrate). In some embodiments, the patterned trenches are spaces between patterned insulators 232. In some embodiments, the patterned insulators are formed on the same insulating layer. In some embodiments, the patterned insulators are deposited on the insulating layer (e.g., insulating layer 220).

Amorphous silicon layer 234 is then deposited on the first trenches and on the patterned insulators. In some embodiments, the thickness of the amorphous silicon is substantially uniform and less than the height of the first trenches (e.g., the amorphous silicon does not fill the first trenches). Therefore, the amorphous silicon layer would include second trenches 236 that are above the first trenches. Patterned metals 238 can be deposited on top of the second trenches 236, and silicide 240 can be formed using the methods described above. Due to the patterned insulators and the insulating layer below the amorphous silicon layer, the formed silicide can be confined in the first trenches. In an embodiment, given the dimensions and mass of the patterned metals and amorphous silicon, the dimensions and mass can be controlled such that the height of the formed silicide is substantially the same as the height of the first trenches, thereby creating silicide crossovers without an offset. In some embodiments, a seal 242 can be applied above the silicide crossovers; the seal can be substantially similar to the seals described herein (e.g., seal metal ring 206, seal 226).

Although specific dopants, silicide, and resistivity are described, it is understood that the planar semiconductor layer can have properties different than ones described above. For example, depending on the requirements of the device (e.g., timing requirements such as delay, power requirements such as IR drop), the conductive crossovers may be more or less conductive than described for the purpose of optimization.

Although specific methods of silicide formation are described, it is understood that other methods of silicide formation can form the conductive crossovers without departing from the scope of the disclosure.

In some embodiments, once the crossovers are formed (e.g., conductive regions are defined) using the methods described above, each set of crossovers corresponding to a device can be separated. An insulating layer and a seal metal ring can be deposited above the crossover, creating the vacuum and non-vacuum regions of the devices described herein.

In some embodiments, at least one of the crossovers is electrically coupled to a via. For example, the via allows the crossover to electrically couple to another electrical element (e.g., routing on a different layer, pins or inputs on a device).

In some embodiments, at least one of the crossovers is electrically coupled to a bolometer array. In some embodiments, the bolometer array resides in the vacuum region. In some embodiments, at least one of the conductive crossovers is electrically coupled to a circuit associated with the bolometer array. In some embodiments, the circuit is a bolometer readout circuit in the non-vacuum region. In some embodiments, the circuit is a voltage driving circuit. In some embodiments, the crossovers are signal lines that traverse the seal region and carry signals between the vacuum and non-vacuum regions.

Figure 3:
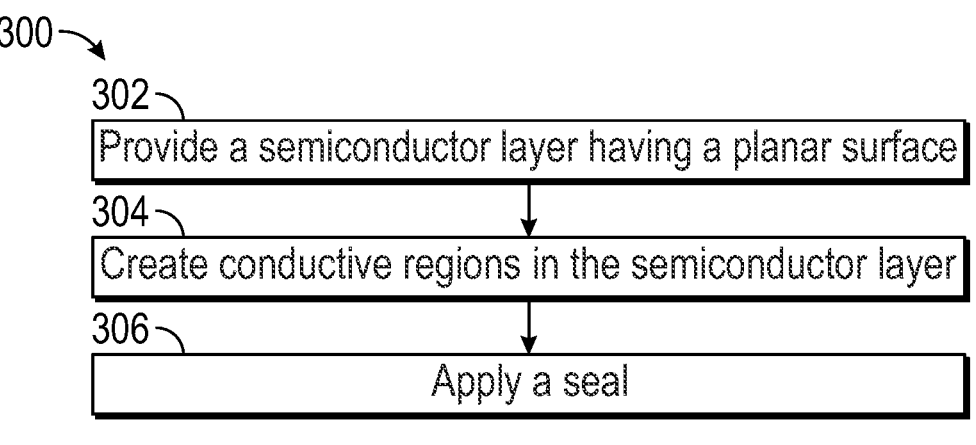
FIG. 3 illustrates a method of forming conductive crossovers in a seal region having a planar topography according to examples of the disclosure.

FIG. 3 illustrates a method 300 of forming conductive crossovers in a seal region having a planar topography according to examples of the disclosure. Method 300 includes providing a semiconductor layer having a planar surface (step 302). For example, the semiconductor layer can be the semiconductor layer described with respect to FIGS. 2A-2D. In some embodiments, the semiconductor layer is an amorphous silicon layer.

Method 300 includes creating conductive regions (e.g., conductive crossovers) in the semiconductor layer by modifying a composition of the semiconductor layer to be conductive (step 304). In some embodiments, creating conductive regions in the semiconductor layer further includes modifying the composition of regions of the semiconductor layer below the planar surface to be conductive. For example, the conductive regions are created by increasing the conductivity of defined regions of the semiconductor layer, as described herein.

In some embodiments, creating the conductive regions does not include planarization of the semiconductor layer. For example, if metal deposition is not required to create the conductive regions, then no step would be created and planarization would not be required, as described herein.

In some embodiments, the conductive regions are created without changing a topography of the semiconductor layer. In some embodiments, the conductive regions are created without removing material from the semiconductor layer.

In some embodiments, creating the conductive regions in the semiconductor layer includes doping the conductive regions. In some embodiments, doping the conductive regions further includes N-type doping the regions (e.g., doping the conductive regions with N-type dopants). In some embodiments, the method further includes doping non-conductive regions with P-type dopants. In some embodiments, non-conductive regions in the semiconductor layer include undoped semiconductor. In some embodiments, the method further includes oxidizing non-conductive regions. For the sake of brevity, exemplary semiconductor material, dopants, and doping methods are described above with respect to FIGS. 2A and 2B. For brevity, the description will not be repeated here.

In some embodiments, creating conductive regions in the semiconductor layer includes forming a silicide in the conductive regions. For the sake of brevity, exemplary silicide formation methods in the conductive regions described above with respect to FIGS. 2C-2D. For brevity, the description will not be repeated here.

Method 300 includes applying a seal (step 306). In some embodiments, applying a seal includes applying a hermetic seal above the planar surface to create a hermetically sealed volume. For example, as described with respect to FIGS. 2A-2D, the vacuum region is created by bonding a seal metal ring to a device that includes the semiconductor layer. As another example, as described with respect to FIGS. 2A-2D, the vacuum region is created by bonding a non-conductive seal to a device that includes the semiconductor layer.

In some embodiments, a conductive region of the conductive regions comprises a first part and a second part, the first part of the conductive region is in the hermetically sealed volume (e.g., the vacuum region), and the second part of the conductive region is not below the hermetically sealed volume (e.g., the non-vacuum region). For example, as described with respect to FIGS. 2A-2D, at least one of the conductive crossovers includes a portion in the vacuum region and a portion in the non-vacuum region.

In some embodiments, a non-vacuum region surrounds the vacuum region, and an interface between the vacuum region and the non-vacuum region is planar. For example, as described with respect to FIG. 2A, the non-vacuum region surrounds the vacuum region, and the seal area is planar.

In some embodiments, the semiconductor layer spans a dimension greater than 620 mm by 750 mm. In some embodiments, the semiconductor layer includes a plurality of portions, each corresponding to a single device; the illustrated semiconductor layer is one portion of the semiconductor layer.

In some embodiments, the method 300 includes electrically coupling a via to the conductive region. In some embodiments, the method 300 includes electrically coupling the conductive region to a bolometer circuit.

In some embodiments, the method 300 includes providing an insulating layer above the semiconductor layer. For example, as described with respect to FIG. 2B, the insulating layer is the insulating layer 204. As used herein, a second layer (e.g., insulating layer 204) is "above" a first layer (e.g., semiconductor layer 202) when the second layer is located in a direction opposing the substrate (e.g., substrate 210) relative to the first layer.

In some embodiments, the method 300 includes depositing the semiconductor layer on a glass substrate. For example, as described with respect to FIGS. 2A-2D, the device 200, which includes the semiconductor layer, can be deposited on a glass substrate.

Examples of the disclosure include methods of bonding two planar semiconductor layers and devices created by these methods. In the exemplary methods according to examples of the disclosure, planarization steps can be forgone prior to bonding.

Figure 4A:
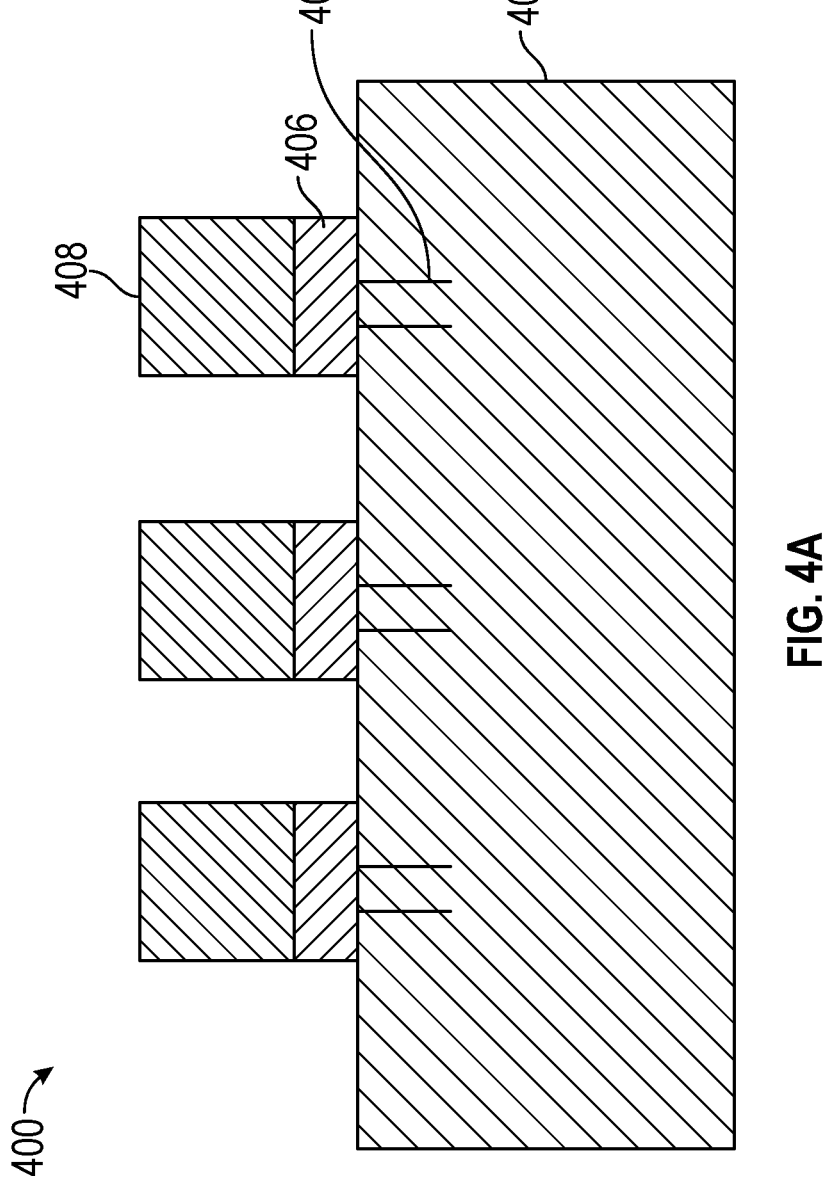
FIGS. 4A-4D illustrate a known exemplary bonding method.

FIGS. 4A-4D illustrate a known exemplary bonding method. FIG. 4A illustrates a first layer 400 that includes starting wafer 402, copper interconnects 404, seed layer 406, and patterned metal 408.

Figure 4B:
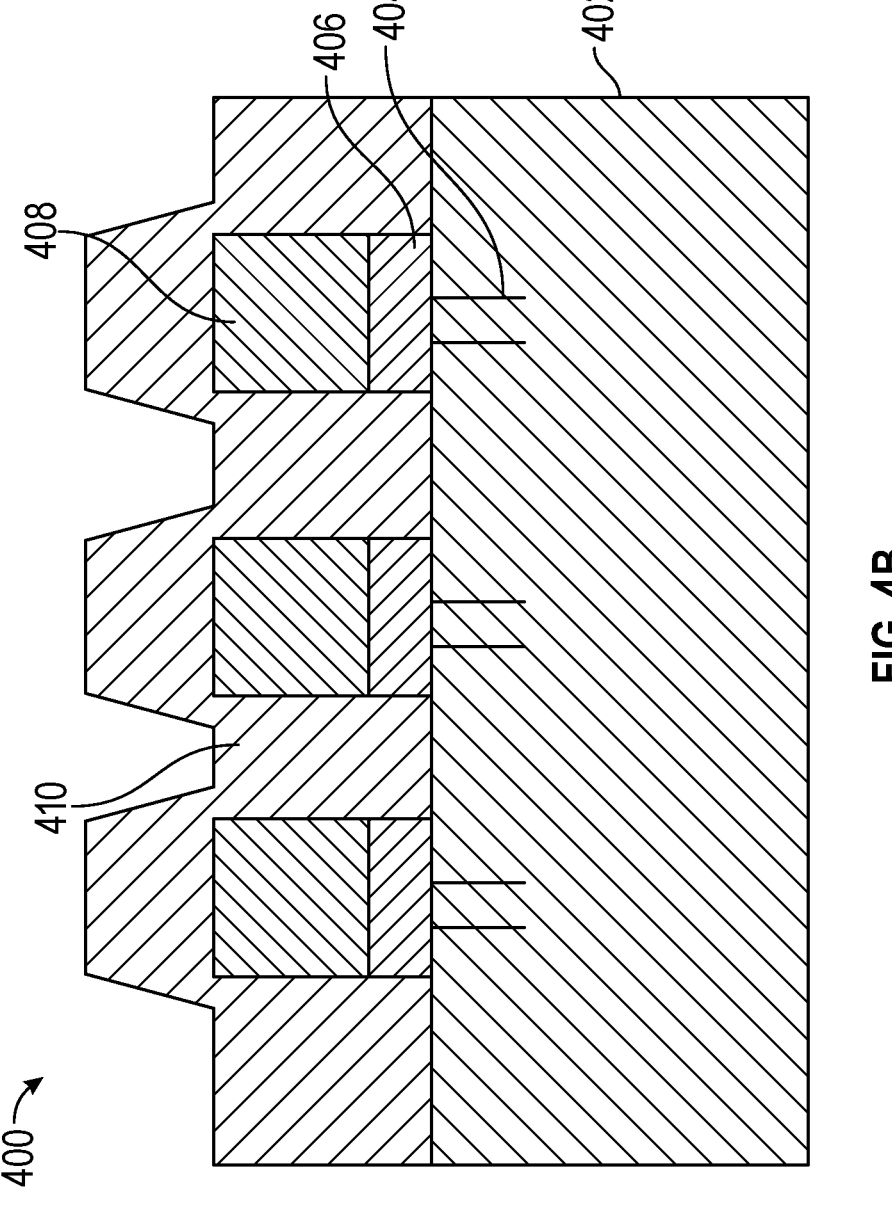

FIG. 4B illustrates the first layer 400 after an oxide layer 410 is deposited above the wafer and the patterned metal. As illustrated, the oxide layer 410 fills the gaps between adjacent patterned metal 408 and includes steps due to the pattern metal. In order to create a planar surface for bonding, the first layer 400 needs to be planarized.

Figure 4C:
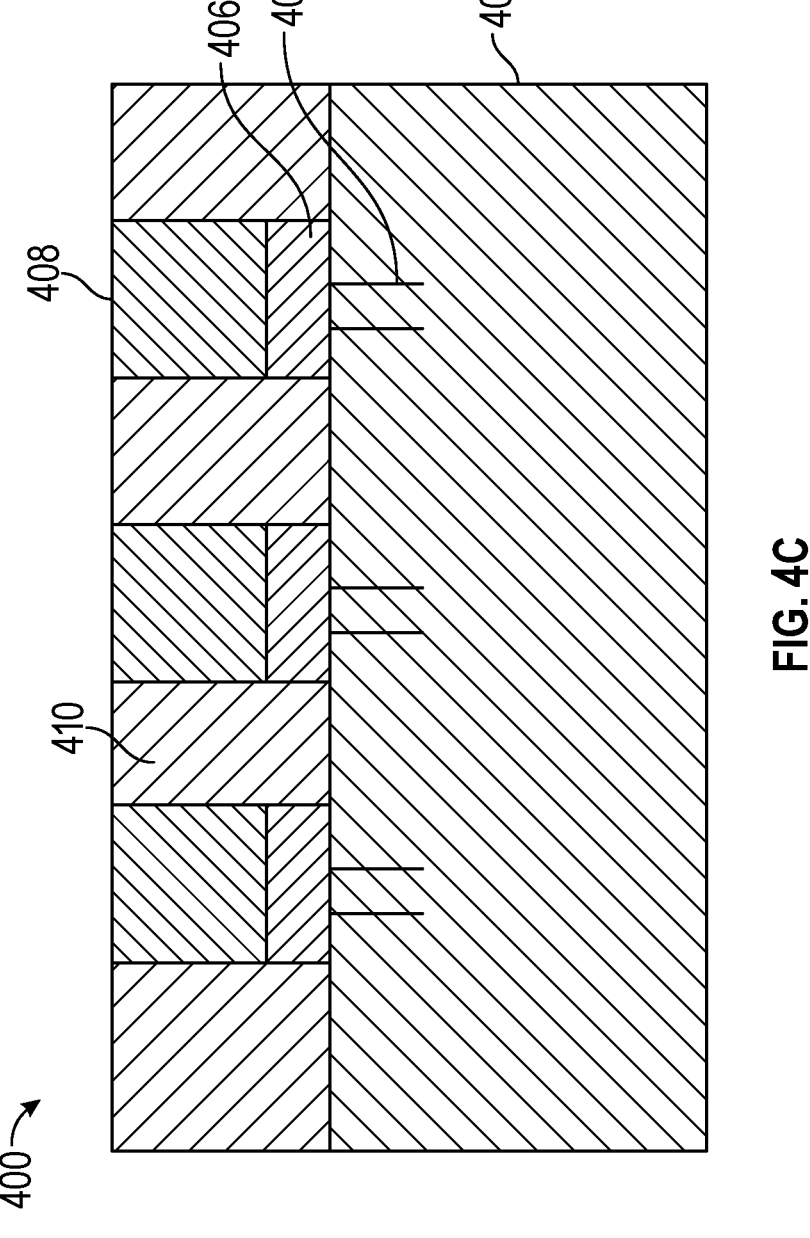

FIG. 4C illustrates the first layer 400 after planarization. For example, the first layer is planarized using CMP. After planarization, portions of the oxide layer above the patterned metal are removed, exposing the patterned metal, and the remaining oxide layer and patterned metal are planar.

Figure 4D:
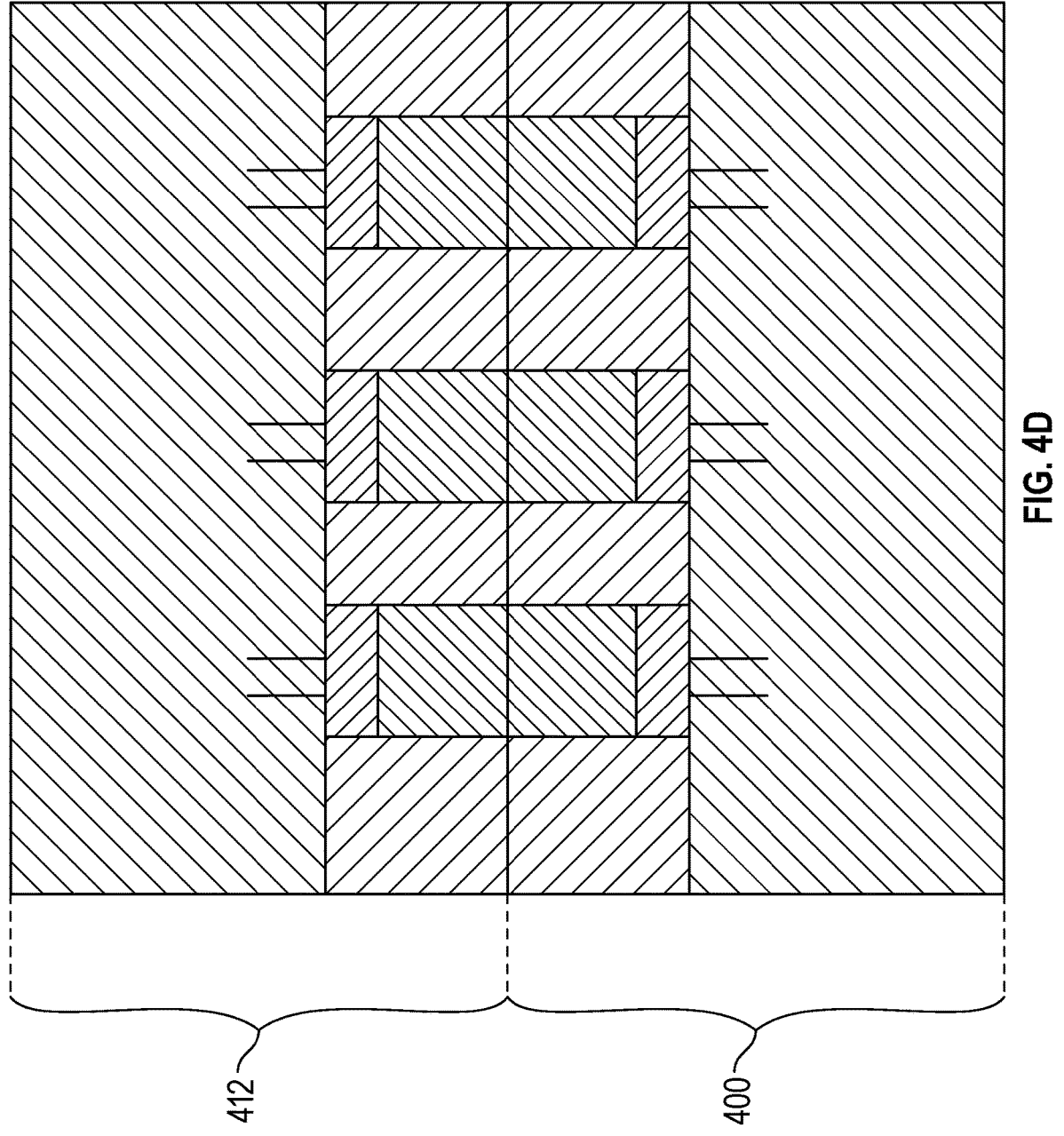

FIG. 4D illustrates the first layer 400 bonded to a second layer 412. The second layer 412 is substantially similar to the first layer 400. In other words, the second layer 412 is fabricated with the method described with respect to FIGS. 4A-4C. Specifically, in order to ensure a good bond between the first and second layers, the interfacing surfaces of the first and second layers are planarized.

FIGS. 5A-5D illustrate a method of bonding two planar semiconductor layers according to examples of the disclosure.

Figure 5A:
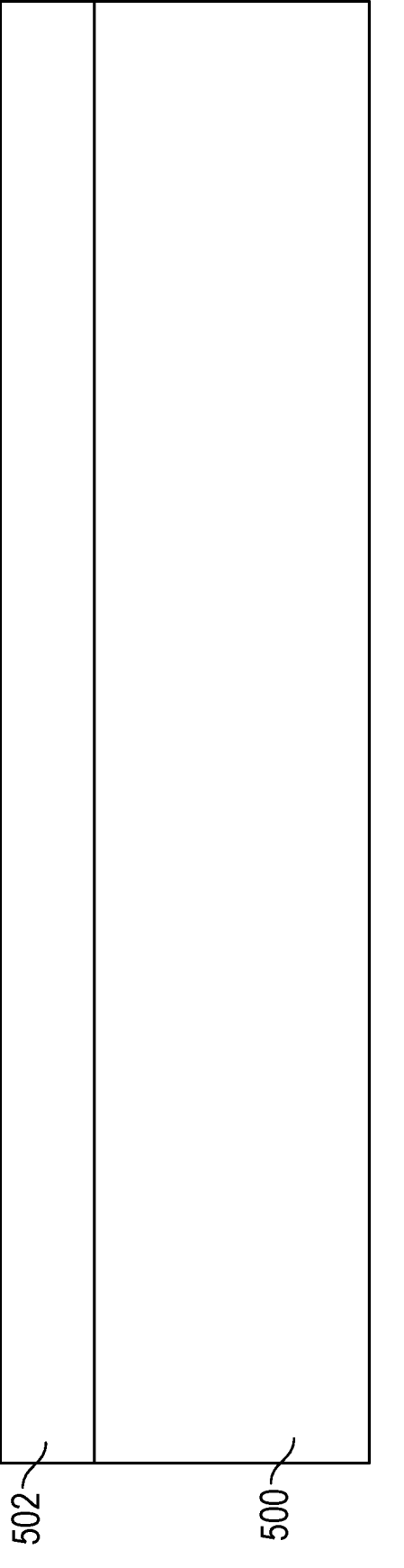
FIGS. 5A-5F illustrate a method of bonding two planar semiconductor layers according to examples of the disclosure.

FIG. 5A illustrates a first semiconductor layer 502 deposited on substrate 500. In some embodiments, the first semiconductor layer 502 includes a planar surface. In some embodiments, the first semiconductor layer 502 is undoped amorphous silicon. It is understood that the illustrated configuration is merely exemplary. Additional layers or different combinations of layers may be included with the semiconductor layers without departing from the scope of the disclosure.

In some embodiments, since the semiconductor layer has a planar surface, planarization (e.g., CMP) of the semiconductor layer is not required (e.g., removal of an oxide layer is not required, as illustrated in FIG. 1C). In some embodiments, the use of CMP may be reduced when the semiconductor layer has a planar surface. As an exemplary advantage, complexity and cost of manufacturing the device can be reduced when planarization steps are omitted from the manufacturing process. In some instances, creating the conductive regions with a semiconductor layer (e.g., without metal or oxide deposition) may be sufficient to meet electrical requirements (e.g., delay, noise, voltage drop) of an electric device that includes the semiconductor layers. Therefore, in these instances, the cost and complexity of the device can be kept lower because device requirements can be met without the need to planarize.

Figure 5B:
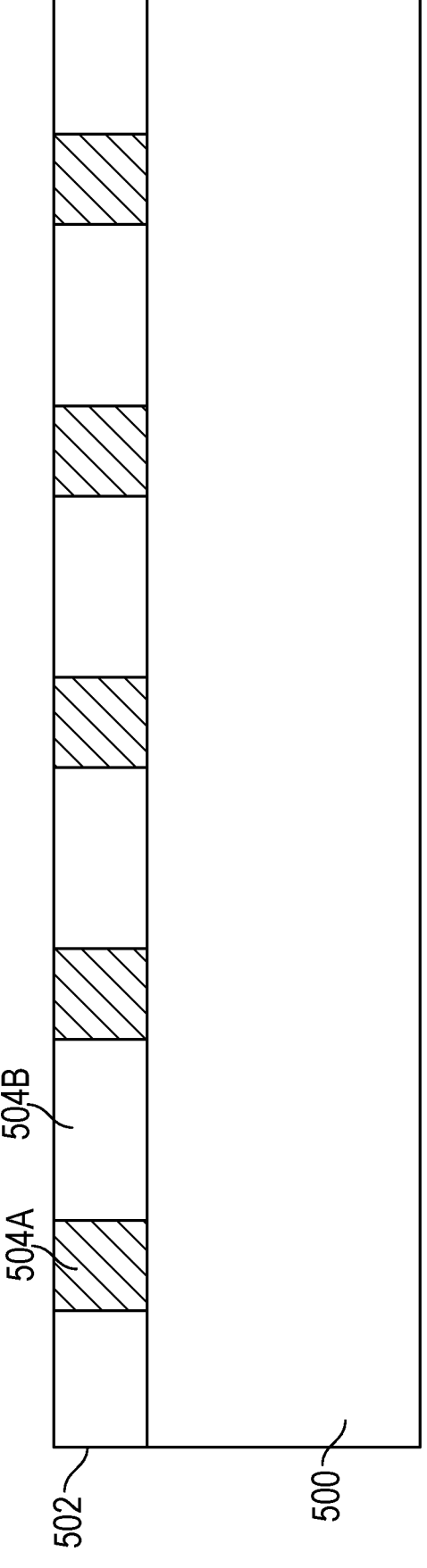

FIG. 5B illustrates the first semiconductor layer 502 after conductive regions 504A have been created. In some embodiments, the layer that includes the conductive regions 504A and non-conductive regions 504B adjacent to the conductive regions.

In some embodiments, the conductive regions 504A are created by modifying a composition of the planar surface of the semiconductor layer to be conductive. For example, prior to modifying its composition, the planar semiconductor layer is an amorphous silicon layer. In some embodiments, the composition of the semiconductor layer below the planar surface is modified to be conductive (e.g., the conductive regions are conductive volumes).

As an example, the width of each conductive region can be between 0.1 and 5 μm, and each conductive region can be 0.1 to 5 μm apart from each other. The semiconductor layer can have a height between 10-500 nm. The conductive regions described and illustrated herein are not limiting, unless otherwise stated. It is understood that the conductive regions can have spacings, dimensions, and properties different than the described embodiments.

In some embodiments, the conductive regions 504A are created by doping specific areas of the planar semiconductor layer. For example, the specific areas are patterns of the conductive regions in bonded semiconductor layers, which are described in more detail below. In some embodiments, the specific areas of the planar semiconductor layer are doped with N-type dopants (e.g., carriers are electrons). In some embodiments, the conductive regions 504A are doped with P-type dopants (e.g., carriers are holes).

In some embodiments, the non-conductive regions 504B are less electrically conductive compared to the conductive regions 504A. In some embodiments, the non-conductive regions 504B include undoped silicon while the conductive regions 504A include a more conductive material (e.g., doped silicon, silicide). In some embodiments, the non-conductive regions 504B are doped with P-type dopants. In some embodiments, the non-conductive regions 504B are oxidized. As an example, non-conductive regions are oxidized to increase the regions' resistances.

For example, amorphous silicon can be doped by precursor gas phase doping in a CVD chamber or by implantation. The N-type dopant can be phosphorous or arsenic. In gas phase, phosphorous can correspond to phosphine ($PH_3$), and arsenic can correspond to Arsine ($AsH_3$). The P-type dopant can be boron, which can correspond to diborane ($B_2H_6$) in gas phase.

In some embodiments, the resistivity of the conductive regions is approximately $10^{12}$ ohm-cm. As an example, a lower resistivity can be achieved for a microcrystalline silicon which approaches 10 milliohm-cm for a gas phase doping ratio of 0.1 ($PH_3/SiH_4$). A lower conductivity can be achieved by lightly doping P-type at an approximately $10^{-5}$ gas phase ratio ($B_2H_6/SiH_4$).

In some embodiments, the conductive regions include a silicide. For example, the conductive regions are conductive silicide channels within an amorphous silicon layer.

In some embodiments, the silicide is formed by patterned deposition of metal onto an amorphous silicon layer. Non-limiting examples of silicide formation are described in WO 2019/178402, the entire contents of which are incorporated herein by reference for all purposes. The pattern corresponds to locations of the conductive regions. For example, the patterned metals are deposited on top of an amorphous silicon layer. The patterned metals and the amorphous silicon can react by annealing. Upon annealing, the patterned metal diffuses with the silicon and forms silicide. The formation of the silicide causes an overall volume reduction compared to the combined volumes of the patterned metals and silicon before diffusion. Given dimensions (e.g., width, height, thickness) and mass of the patterned metals and amorphous silicon, the dimensions of the formed silicide and conductive regions can be derived based on the patterned metals, and a silicide region having desired dimensions can be created using patterned metal having appropriate dimensions and mass.

In some embodiments, the silicide is formed laterally. An insulating layer is located below the amorphous silicon layer. In some embodiments, the insulating layer bounds silicide formation in a lateral direction (i.e., direction parallel to the insulating layer). Given dimensions and mass of the patterned metals, if the insulating layer bounds silicide formation to the lateral direction, then the lateral dimensions (e.g., width) of the silicide conductive regions can be derived. Therefore, a silicide conductive region having a desired width can be created using patterned metal having appropriate dimensions and mass.

Figure 5C:
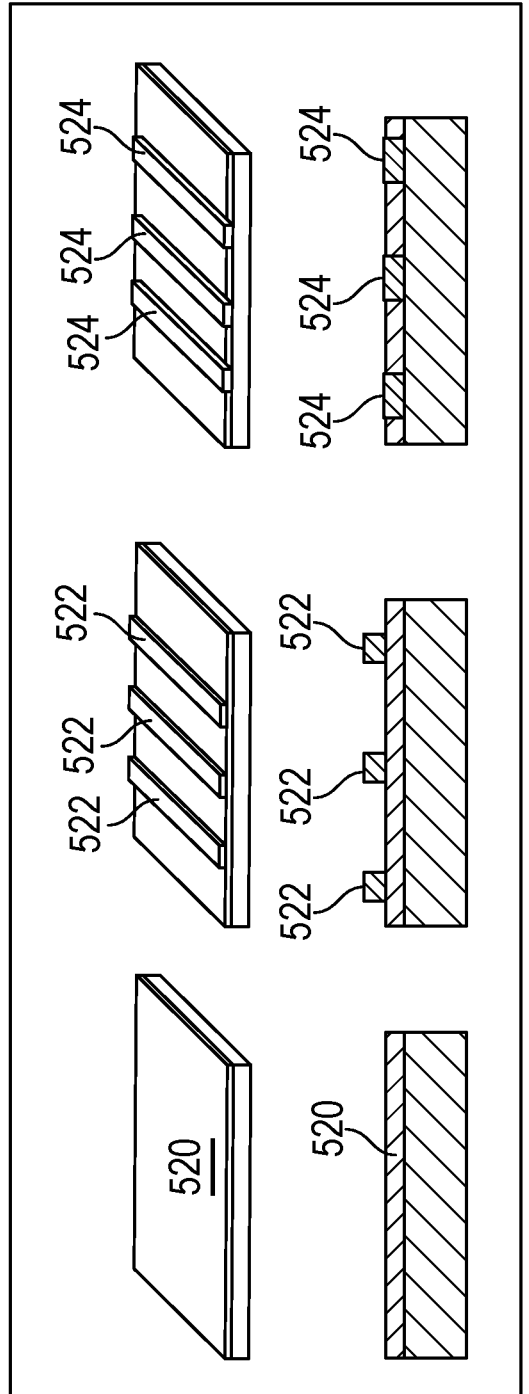

For example, as illustrated in FIG. 5C, patterned metals 522 are deposited on top of an amorphous silicon layer 520. Using any of the described methods (e.g., using patterned metals having the appropriate dimensions and mass to create desired dimensions), silicide conductive regions 524 are formed. This semiconductor layer including silicide conductive regions 524 may be used as first semiconductor layer 502.

In some embodiments, although the formation of silicide can cause an offset in thickness compared to an adjacent amorphous silicon portion, the offset may be small enough to allow for bonding to occur without the need for planarization (e.g., the offset is significantly smaller than the steps). In some embodiments, the offsets have an RMS value of less than 40 nm. Therefore, in some embodiments, depending on device requirements, it may be advantageous to form the conductive regions with silicide to reduce resistivity. For example, resistivity of the NiSi is approximately 4 μohm-cm. As another example, $Ni_2Si$ has a resistivity of approximately 24 μohm-cm.

Figure 5D:
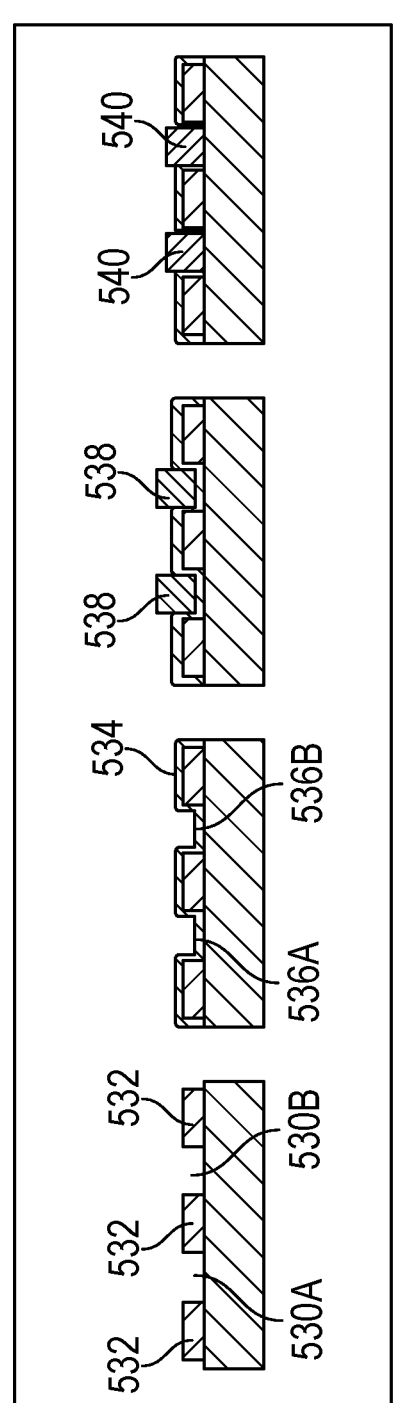

FIG. 5D illustrates an embodiment of the conductive regions. In some embodiments, the silicide conductive regions can be formed without an offset. The silicide conductive regions can be formed by initially creating patterned first trenches 530 above an insulating layer (e.g., glass substrate). In some embodiments, the patterned trenches are spaces between patterned insulators 532. In some embodiments, the patterned insulators are formed on the same insulating layer. In some embodiments, the patterned insulators are deposited on the insulating layer (e.g., insulating layer 520).

Amorphous silicon layer 534 is then deposited on the first trenches and on the patterned insulators. In some embodiments, the thickness of the amorphous silicon is substantially uniform and less than the height of the first trenches (e.g., the amorphous silicon does not fill the first trenches). Therefore, the amorphous silicon layer would include second trenches 536 that are above the first trenches. Patterned metals 538 can be deposited on top of the second trenches 536, and silicide 540 can be formed using the methods described above. Due to the patterned insulators and the insulating layer below the amorphous silicon layer, the formed silicide can be confined in the first trenches. In an embodiment, given the dimensions and mass of the patterned metals and amorphous silicon, the dimensions and mass can be controlled such that the height of the formed silicide is substantially the same as the height of the first trenches, thereby creating silicide conductive regions without an offset. This semiconductor layer including silicide conductive regions 524 may be used as first semiconductor layer 502.

Although specific dopants, silicide, and resistivity are described, it is understood that the planar semiconductor layer can have properties different than ones described above. For example, depending on the requirements of the device (e.g., timing requirements such as delay, power requirements such as IR drop), the conductive regions may be more or less conductive than described.

Although specific methods of silicide formation are described, it is understood that other methods of silicide formation can form the conductive regions without departing from the scope of the disclosure.

Figure 5E:
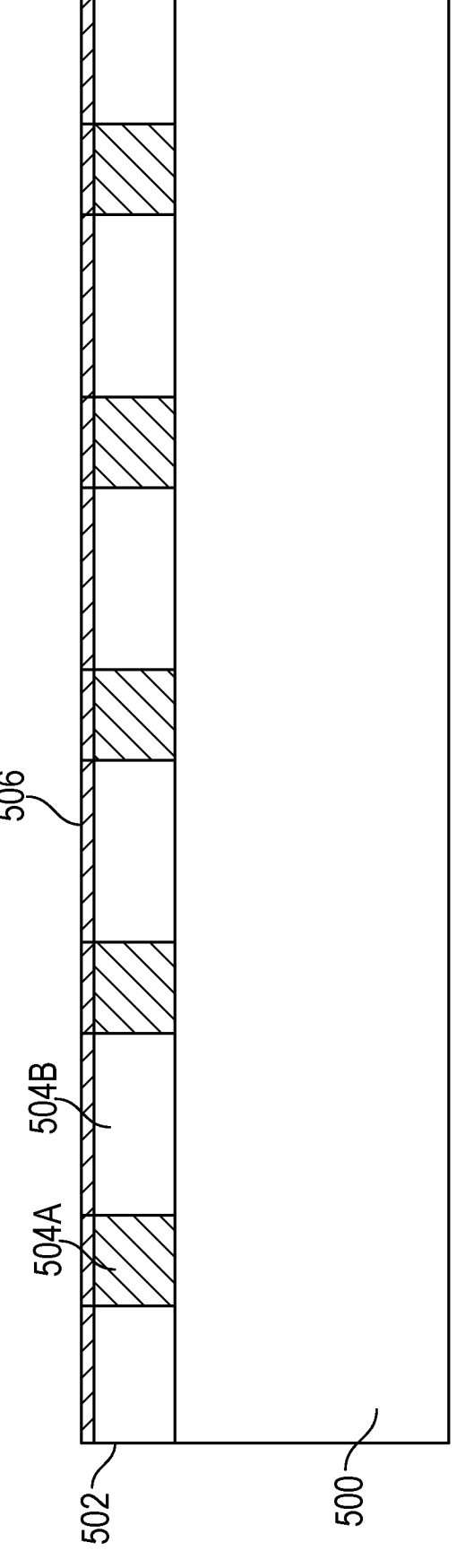

FIG. 5E illustrates the first semiconductor layer 502 after surface treatment 506 is applied. In some embodiments, the top of the first semiconductor layer 502 is treated after the conductive regions 504A are formed. For example, the surface may be prepared for bonding with a second semiconductor layer to enhance adhesion between the two layers. In some embodiments, the surface treatment is a cleaning step that removes contaminant (e.g., native oxides) off the surface. In some embodiments, the surface treatment is a cleaning step that removes weakly bounded material on the layer by using bombardment or chemical processes. In some embodiments, the surface treatment is an adhesion promoting material that would not interfere with the conductive properties of the semiconductor layer. In some embodiments, the surface treatment is a cleaning step while the semiconductor layer is in vacuum to activate the surfaces before bonding. In some embodiments, a planar surface of the first semiconductor layer is treated with plasma. The labels and illustrated regions associated with the surface treatment in the Figures are merely illustrative; it is understood that the labels and illustrated regions may not be representative of physical characteristics of the surface treatment.

Figure 5F:
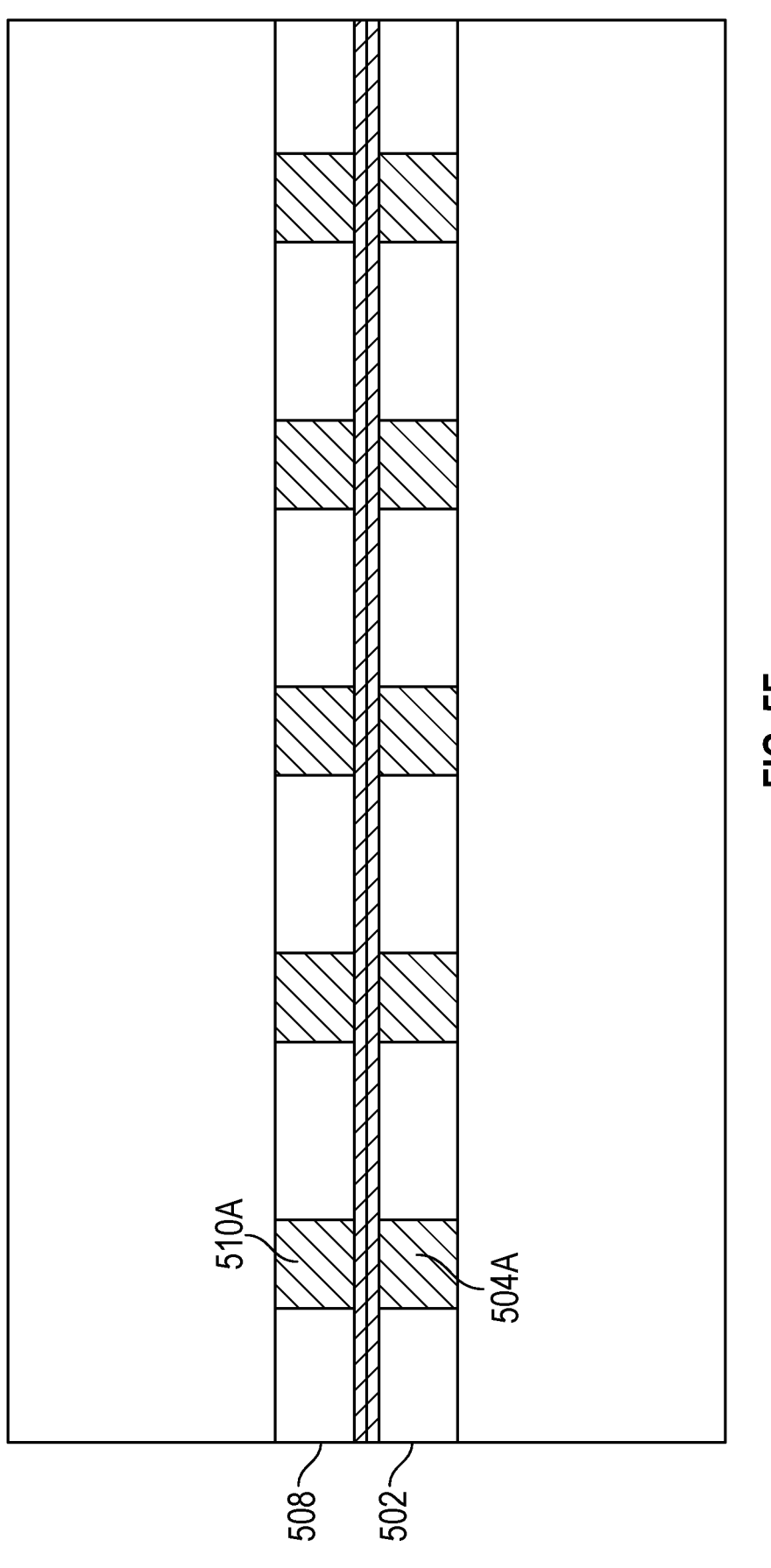

FIG. 5F illustrates the first semiconductor layer 502 bonded to a second semiconductor layer 508. In some embodiments, the respective surface treated semiconductor layer is activated to initiate bonding between the two semiconductor layers. For example, surface activated bonding can be performed using Argon plasma at low pressure (e.g., 0.1 mTorr to 1 Torr) and room temperature. As another example, surface activated bonding can be performed using fast atom bombardment with Argon or Neon at ultra-low pressure (e.g., $10^{-8}$ to $10^{-5}$ Torr) and room temperature. As another example, surface activated bonding can be performed by exposing the surface to acidic or basic reactants at low pressure (e.g., 0.1 mTorr to 1 Torr). Other examples of bonding method include thermocompression (e.g., high force (e.g., 10-80 kN) at elevated temperature (e.g., 100-300C)).

In some embodiments, the second semiconductor layer 508 is bonded on top of the first semiconductor layer 502. In some embodiments, the bonded semiconductor layers are part of an electromechanical device. For example, the bonded conductive regions are signal lines of the electromechanical device. In some embodiments, the bonded semiconductor layers are used in flip-chip bonding.

In some embodiments, the second semiconductor layer is substantially similar to the first semiconductor layer. For example, the second semiconductor layer 508 is fabricated with the method described with respect to FIGS. 5A-5E. Specifically, the second semiconductor layer 508 is a planar semiconductor layer that includes conductive regions that are created with methods according to examples of the disclosure.

In some embodiments, a conductive region 504A of the first semiconductor layer 502 is electrically coupled to a conductive region 510A of the second semiconductor layer 508. For example, a conductive region 504A of the first semiconductor layer 502 and a conductive region 510A of the second semiconductor layer 508 overlap in area and thereby, are electrically coupled together.

In some embodiments, more than one conductive region 504A are electrically coupled to more than one conductive region 510A. In some embodiments, each set of the coupled conductive regions are electrically uncoupled from each other. For example, each set of coupled conductive regions is a different signal or power line.

In some embodiments, the bonded semiconductor layers are part of an electromechanical system, and electromechanical devices may be formed by separating portions of the electromechanical system. For example, prior to separation, a semiconductor layer used to create the conductive regions spans dimensions greater than 620 mm by 750 mm. For example, prior to singulation, the semiconductor layer is deposited above a generation 3.5 glass substrate having dimensions of 620 mm by 750 mm; the semiconductor layer includes a plurality of semiconductor portions arranged in an array, each portion corresponding to a single device. The semiconductor layer can be continuous or discontinuous (e.g., the layer includes breaks or gaps between adjacent portions). In some instances, prior to singulation, the dimensions of the semiconductor layer maybe too large for planarization to be cost-effective (e.g., chemical-mechanical planarization, CMP). Therefore, embodiments described herein may advantageously create a planar semiconductor layer that includes the conductive regions without planarization. In some embodiments, after formation of devices coupled to the semiconductor layer (e.g., bolometers), the stack up of glass substrate, semiconductor layer, and devices may be separated into smaller portions (e.g., wafer size portions) for subsequent manufacturing steps.

Although the conductive regions of the silicon layers are illustrated as being rectangular and evenly spaced apart, it is understood that the bonded silicon layers can include conductive region patterns in other shapes and spacings. Although the exemplary device includes five conductive regions, it is understood that the device may include any number of conductive regions.

FIG. 6 illustrates method 600 of manufacturing an electromechanical system that includes two bonded planar semiconductor layers according to examples of the disclosure. Method 600 includes providing a first semiconductor layer having a first planar surface (step 602). For example, the first semiconductor layer can be the first semiconductor layer described with respect to FIGS. 5A-5E. In some embodiments, the semiconductor layer is an amorphous silicon layer. Although the method 600 is described with respect to manufacturing an electromechanical system, it is understood that the method 600 may be used in other manufacturing processes, such as flip-chip bonding.

Method 600 includes creating conductive regions in the first semiconductor layer by modifying a composition of the first planar surface of the semiconductor layer to be conductive (step 604). In some embodiments, creating conductive regions in the semiconductor layer further includes modifying the composition of the semiconductor layer below the planar surface to be conductive. For example, the conductive regions are created by increasing the conductivity of defined regions of the first semiconductor layer, as described with respect to FIGS. 5A-5D.

Method 600 includes providing a second semiconductor layer having a second planar surface (step 606). For example, the second semiconductor layer can be the second semiconductor layer described with respect to FIGS. 5A-5F. In some embodiments, the second semiconductor layer is an amorphous silicon layer.

Method 600 includes creating conductive regions in the second semiconductor layer by modifying a composition of the second planar surface of the semiconductor layer to be conductive (step 608). In some embodiments, creating conductive regions in the second semiconductor layer further includes modifying the composition of the second semiconductor layer below the planar surface to be conductive. For example, the second conductive regions are created by increasing the conductivity of defined regions of the second semiconductor layer, as described with respect to FIGS. 5A-5D.

In some embodiments, creating the conductive regions does not include changing a topography of the first and second semiconductor layers. For example, if metal or oxide deposition (as described with respect to FIGS. 4A-4D) is not required to create the conductive regions, then no step would be created and planarization would not be required, as described herein. In some embodiments, the conductive regions are created without removing material from the semiconductor layers.

In some embodiments, creating the conductive regions in the first and second semiconductor layers includes doping the conductive regions. In some embodiments, doping the conductive regions further includes doping the conductive regions with N-type dopants. In some embodiments, the method further includes doping non-conductive regions with P-type dopants. In some embodiments, non-conductive regions in the first and second semiconductor layer include undoped semiconductor. In some embodiments, the method further includes oxidizing non-conductive regions. For the sake of brevity, exemplary semiconductor material, dopants, and doping methods (e.g., as described with respect to FIGS. 5A and 5B) are not described again.

In some embodiments, creating conductive regions in the semiconductor layer includes forming a silicide in the conductive regions (e.g., as described with respect to FIGS. 5C and 5D). For the sake of brevity, exemplary silicide formation methods in the conductive regions are not described again.

In some embodiments, the method includes surface treating the first and second planar layers. For example, the top of first semiconductor layer 502 and second semiconductor layers 508 are surface-treated, as described with respect to FIGS. 5E and 5F.

Method 600 includes bonding the first and second semiconductor layers, wherein the second planar surface is parallel to the first planar surface (step 610). For example, as described with respect to FIG. 5F, the surface-treated respective semiconductor layer is activated to initiate bonding between the two semiconductor layers. For example, surface activated bonding can be performed using Argon plasma at low pressure (e.g., 0.1 mTorr to 1 Torr) and room temperature. As another example, surface activated bonding can be performed using fast atom bombardment with Argon or Neon at ultra-low pressure (e.g., $10^{-8}$ to $10^{-5}$ Torr) and room temperature. As another example, surface activated bonding can be performed by exposing the surface to acidic or basic reactants at low pressure (e.g., 0.1 mTorr to 1 Torr). Other examples of bonding method include thermocompression (e.g., high force (e.g., 10-80 kN) at elevated temperature (e.g., 100-300C)).

Method 600 includes electrically coupling the second semiconductor layer to the first semiconductor layer (step 612). For example, conductive regions 504A and 510A are electrically coupled to each other, and the second semiconductor layer 508 is bonded on top of the first semiconductor layer 502, as described with respect to FIG. 5F. In some embodiments, the electrically coupled conductive regions form a signal line of an electromechanical system.

In some embodiments, electrically coupling the second semiconductor layer to the first semiconductor layer includes electrically coupling a conductive region of the second semiconductor layer to a conductive region of the first semiconductor layer. For example, as described with respect to FIG. 5F, a conductive region 504A and a conductive region 510A substantially overlap with each other in area.

In some embodiments, the method further includes electrically coupling a second conductive region of the conductive regions of the first semiconductor layer to a second conductive region of the conductive regions of the second semiconductor layer, wherein the second conductive regions (e.g., second pair of electrically coupled conductive regions) are electrically uncoupled from the first conductive regions (e.g., first pair of electrically coupled conductive regions). For example, as described with respect to FIG. 5F, a second conductive region 504A is electrically coupled to a second conductive region 510A and the second set of conductive regions are electrically uncoupled from the first set of coupled conductive regions.

In some embodiments, the method further includes separating the bonded semiconductor layers into a plurality of separated portions, each separate portion associated with an electromechanical system. For example, prior to separation, a semiconductor layer used to create the conductive regions spans dimensions greater than 620 mm by 750 mm. For example, prior to singulation, the semiconductor layer is deposited above a generation 3.5 glass substrate having dimensions of 620 mm by 750 mm; the semiconductor layer includes a plurality of semiconductor portions arranged in an array, each portion corresponding to a single device. The semiconductor layer can be continuous or discontinuous (e.g., the layer includes breaks or gaps between adjacent portions). In some instances, prior to singulation, the dimensions of the semiconductor layer maybe too large for planarization to be cost-effective (e.g., chemical-mechanical planarization, CMP). Therefore, embodiments described herein may advantageously create a planar semiconductor layer that includes the conductive regions without planarization. In some embodiments, after formation of devices coupled to the semiconductor layer (e.g., bolometers), the stack up of glass substrate, semiconductor layer, and devices may be separated into smaller portions (e.g., wafer size portions) for subsequent manufacturing steps.

In some embodiments, since the semiconductor layer is planar (e.g., protrusions are not created during formation of the conductive regions), planarization (e.g., chemical-mechanical planarization) of the semiconductor layer is not required. As an exemplary advantage, complexity and cost of manufacturing the device can be reduced because planarization steps are no longer required. In some instances, creating the conductive regions with a semiconductor layer (e.g., without metal deposition) may be sufficient to meet electrical requirements (e.g., delay, noise, voltage drop) of the device. Therefore, in these instances, the cost and complexity of the device can be kept lower because device requirements can be met without the need to planarize. In those instances where planarization is not a viable alternative (for example, on a plate level processing scale), embodiments disclosed herein can facilitate processing by eliminating the planarization step.

Figure 7A:
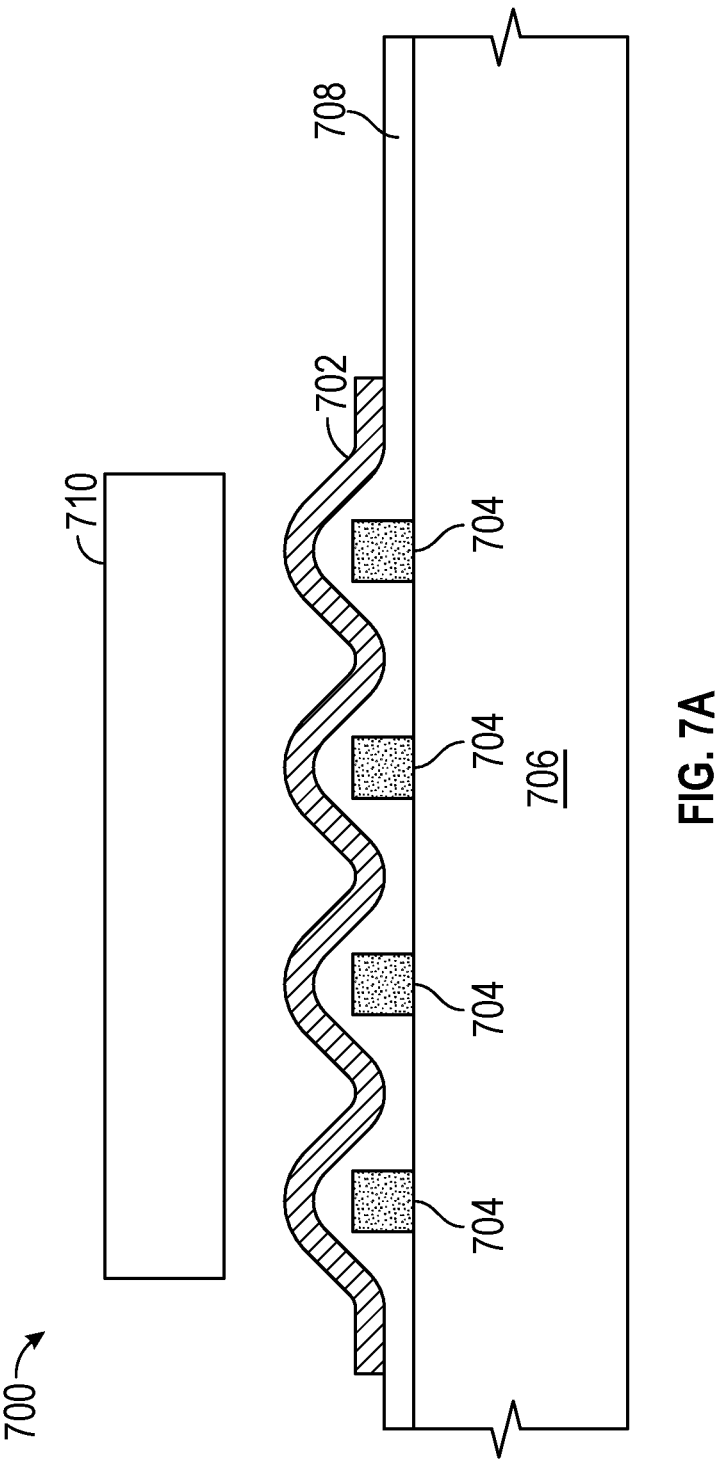
FIG. 7A illustrates an exemplary sealing structure of an electromechanical device.

FIG. 7A illustrates an exemplary sealing structure of an electromechanical device 700. In some embodiments, FIG. 7A illustrates a method of forming a sealing structure for vacuum packaging. For example, the sealing structure is a part of electromechanical device 700, which includes vacuum packaging. In some embodiments, the illustrated area is a bonding area (e.g., seal region) of electromechanical device 200 or electromechanical device 900, and the disclosed method of forming the sealing structure advantageously increases adhesion (e.g., reduce detachments) and/or uniformity of adhesion of a package lid (e.g., for a vacuum package) to a substrate. It is understood that FIG. 7A is exemplary and that the electromechanical device 700 may include different arrangements of the illustrated features and/or more or less of the described features.

As illustrated in FIG. 7A, in some embodiments, adhesion of interfacial layers 702 (e.g., an interfacing layer of a package lid configured to secure a vacuum inside the package) may be promoted by introducing features 704 in the bonding area on a substrate 706 (e.g., a non-silicon substrate, a glass substrate). In some embodiments, the features comprise a conductive (e.g., metallic) material. In some embodiments, the features comprise a non-conductive (e.g., non-metallic) material. In some embodiments, a material of the features is selected for compatibility with subsequent processing.

In some embodiments, the features are fabricated using the methods described with respect to FIGS. 2A-2D and 3

(e.g., the features may be created using a method of creating crossovers). In some embodiments, the features are fabricated using the methods described with respect to FIGS. 2A-2D and 3 and increasing a height between adjacent regions (e.g., by etching) formed by the methods described with respect to FIGS. 2A-2D and 3. By increasing the height between adjacent regions to form the features, adhesion with an interfacing portion (e.g., a package lid, a seal ring, a second portion of the electromechanical device) and/or uniformity of adhesion with the interfacing portion (e.g., a package lid, a seal ring, a second portion of the electromechanical device) is advantageously improved. This may be particularly advantageous when combined with other embodiments herein which increase planarity of a semiconductor surface. In some embodiments, the features interface with seal metal ring 206 or a package lid in locations without functional conductive crossovers (e.g., conductive crossovers that conduct signals for operating the electromechanical device). In some embodiments, the features are electrically uncoupled from the device. For example, the features comprise conductive crossovers that are electrically uncoupled (e.g., insulated) from signal lines of the device. As another example, the features comprise a non-conductive material (e.g., created using the methods described with respect to FIGS. 2A-2D). In some embodiments, the features do not extend beyond a length of a functional conductive crossover (e.g., conductive crossovers that conduct signals for operating the electromechanical device (e.g., described with respect to FIGS. 2A-2D)). For example, the features comprise conductive crossovers (e.g., non-functional conductive crossovers) that terminate in the seal region or either side of the seal region of the device. In some embodiments, for simplicity, regions not including the features (e.g., non-conductive regions, regions at a lower height than the features) are not shown.

In some embodiments, the electromechanical device 700 does not include an insulating layer. In some embodiments, an insulating layer 708 is added, depending on application and sidewall slope of the features 704. For example, the interfacial layer 702 deposited may require complete isotropic coverage of internal corners (e.g., formed by the features 704), and if the features 704 have 90 degree sidewalls, an insulating layer 708 may be added to fill potential voids between the features 704 and the interfacial layer 702.

In some embodiments, electrical shorting of the solder (e.g., corresponding to preform 710) to features 704 (e.g., the features are conductive) may be detrimental to device performance. In some embodiments, to avoid this electrical shorting, the features 704 are coated with a dielectric layer (e.g., insulating layer 708) (e.g., via PECVD or other high-pressure techniques) before the interfacial layer 702 is adhered. By coating the features with the dielectric layer, conformal coating can be achieved, advantageously reducing systemic voiding at the corners.

Figure 7B:
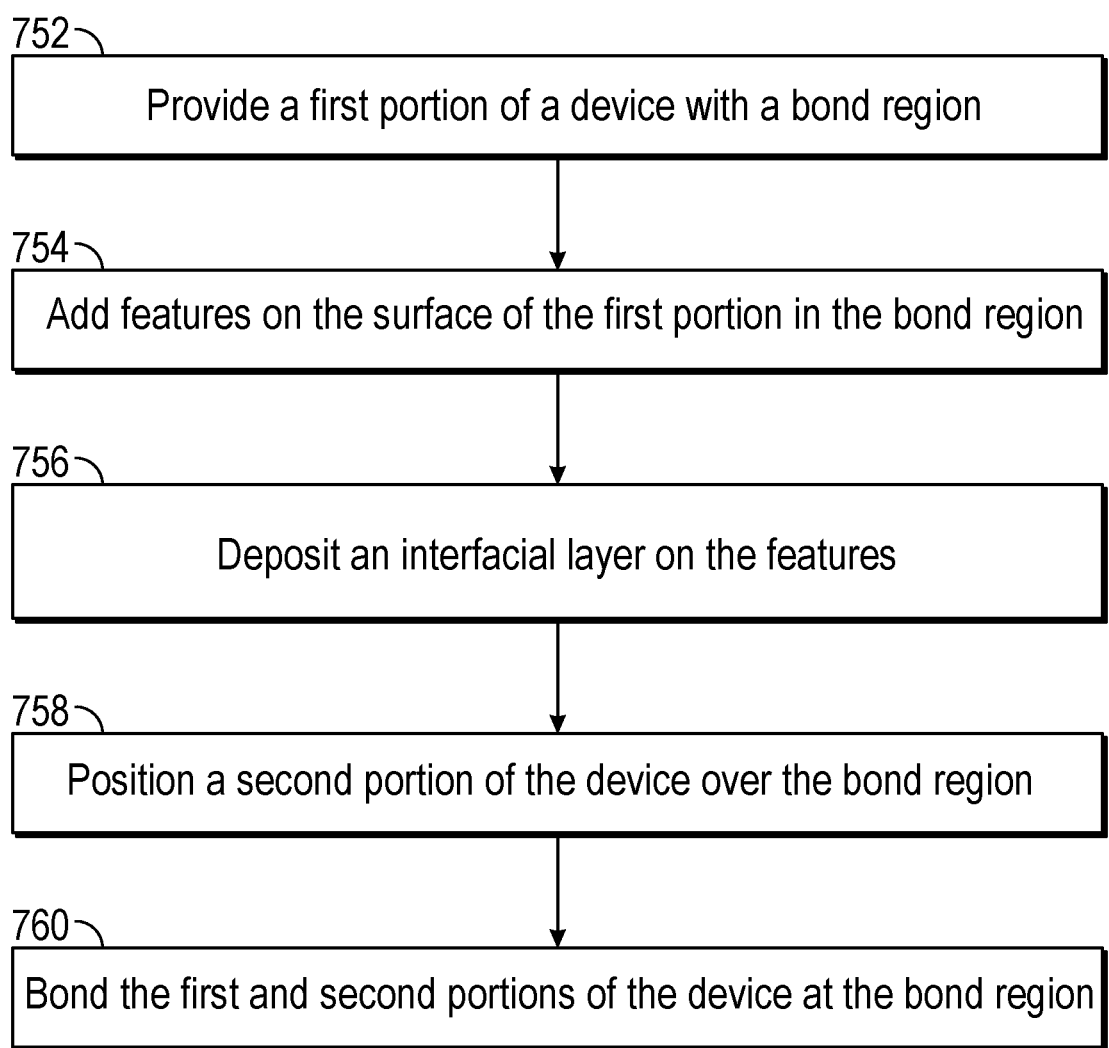
FIG. 7B illustrates a method of forming a sealing structure.

FIG. 7B illustrates a method 750 of forming a sealing structure. In some embodiments, the method 750 of manufacturing an electromechanical device includes providing a first portion of a device with a bond region (step 752). For example, a portion of an electromechanical device 700 is provided, and the portion of the device includes a bond region, as illustrated in FIG. 7A.

In some embodiments, the method includes adding features on the surface of the first portion in the bond region (step 754). For example, features 704 are added above the substrate 706. In some embodiments, the features 704 are added using the methods described with respect to FIGS. 2A-2D and 3. In some embodiments, the features 704 are added using the methods described with respect to FIGS. 2A-2D and 3 and increasing a height between adjacent regions (e.g., by etching) formed by the methods described with respect to FIGS. 2A-2D and 3.

In some embodiments, the method includes depositing an interfacial layer on the features (step 756). For example, interfacial layer 702 is deposited onto the electromechanical device 700. In some embodiments, the method includes positioning a second portion of the device over the bond region (step 758). For example, a package lid is positioned over the bond region of the electromechanical device 700 (e.g., for bonding the package lid to the first portion of the device).

In some embodiments, the method includes bonding the first and second portions of the device at the bond region (step 760). For example, a package lid is bonded to the first portion of the electromechanical device 700.

In some embodiments, the method includes depositing an insulating layer between the features and the interfacial layer. For example, insulating layer 708 is deposited between the features 704 and the interfacial layer 702. In some embodiments, the first portion does not include a silicon substrate. For example, the substrate 706 is a non-silicon substrate. In some embodiments, the features comprise a conductive material. For example, the features 704 comprise a conductive material (e.g., conductive material formed with the methods described with respect to FIGS. 2A-2D and 3, a metallic material).

Although the method of manufacturing the electromechanical device is described as including the recited steps, it is understood that the method may include additional or less steps or different orders of steps than described, and that the method may be performed with steps of other methods disclosed herein.

As used herein, a physical feature is "planar" if a surface corresponding to the physical feature is substantially flat over an area. For example, the surface of the semiconductor layer has a root means square (RMS) roughness of a height (e.g., less than 1 nm, less than 40 nm) across the surface.

For instance, a disclosed semiconductor layer is planar at least at an interface region (e.g., with a seal ring 206, with a package lid, with a second semiconductor layer (e.g., semiconductor layer of second layer described with respect to FIG. 5F)). For example, the interface region is an interface region for sealing, and a surface of the interface region is "planar" if a seal ring or a second interfacing region of a device (e.g., a second portion of the device, a package lid) can bond to the interface region and maintain a specific vacuum (e.g., within the seal ring, within the package lid, within an enclosure formed with the second portion of the device). As another example, the interface region is an interface region with a second semiconductor layer, and a surface of the interface region is "planar" if the surface is substantially flat such that two interfacing conductive regions (e.g., one from the first semiconductor layer and one from the second semiconductor layer) can bond to each other and maintain a specific conductivity between electrically coupled conductive regions. In some examples, a surface of the semiconductor layer is "planar" without planarization of the semiconductor layer surface.

As used herein, a material is "conductive" if the material has an electrical conductivity that is higher than a less electrically conductive material (e.g., an insulator, undoped semiconductor, p-type semiconductor). The less electrically conductive material may be a "non-conductive" material. Specifically, more electrical current would traverse a conductive material compared to a non-conductive material under an equivalent electrical potential. For example, as described with respect to FIG. 2A-2D, 5A-5F, or 7A, the disclosed conductive regions are more conductive than the disclosed non-conductive regions; under a same voltage, substantially more electrical current would traverse the conductive regions compare to the non-conductive regions. The conductivity of a conductive material may be at a level that is sufficient to meet electrical requirements (e.g., delay, noise, voltage drop, a sufficient amount of current meeting device requirements may be conducted) of the device (e.g., electromechanical device 200, electromechanical device described with respect to FIGS. 5A-5F, electromechanical device 700, electromechanical device 900).

Although "electrically coupled" and "coupled" are used to describe the electrical connections between two electrical elements in this disclosure, it is understood that the electrical connections do not necessarily need direct connection between the terminals of the components being coupled together. Different combinations and connections of the recited components can exist without departing from the scope of this disclosure. For example, the terminals of the components are electrically coupled together using electrical routing. In another example, a closed (conducting) switch is connected between the terminals of the components being coupled together. In yet another example, additional elements connect between the terminals of the components being coupled together without affecting the characteristics of the circuit. For example, buffers, amplifiers, and passive circuit elements can be added without affecting the characteristics of the circuits and departing from the scope of this disclosure.

Similarly, although "electrically uncoupled" is used to describe electrical disconnects between two elements of the circuits in this disclosure, it is understood that electrical disconnects do not necessary need to be physically open between the terminals of the components being switched. It is also understood that "uncoupled" is not limited to mean prevention of electrical energy transfer between two elements. For example, high-impedance elements are connected between the terminals of the components being uncoupled. In another example, an opened (non-conducting) switch is connected between the terminals of the components being uncoupled, effectively uncoupling the components.

Generally, as used herein, the term "substantially" is used to describe element(s) or quantity(-ies) ideally having an exact quality (e.g., fixed, the same, uniformed, equal, similar, proportional), but practically having qualities functionally equivalent to the exact quality. For example, an element or quantity is described as being substantially fixed or uniform can deviate from the fixed or uniform value, as long as the deviation is within a tolerance of the system (e.g., accuracy requirements, etc.). As another example, two elements or quantities described as being substantially equal can be approximately equal, as long as the difference is within a tolerance that does not functionally affect a system's operation.

Likewise, although some elements or quantities are described in an absolute sense without the term "substantially", it is understood that these elements and quantities can have qualities that are functionally equivalent to the absolute descriptions. For example, in some embodiments, a ratio is described as being one. However, it is understood that the ratio can be greater or less than one, as long as the ratio is within a tolerance of the system (e.g., accuracy requirements, etc.), unless the context clearly indicates otherwise.

Figures 8, 9:
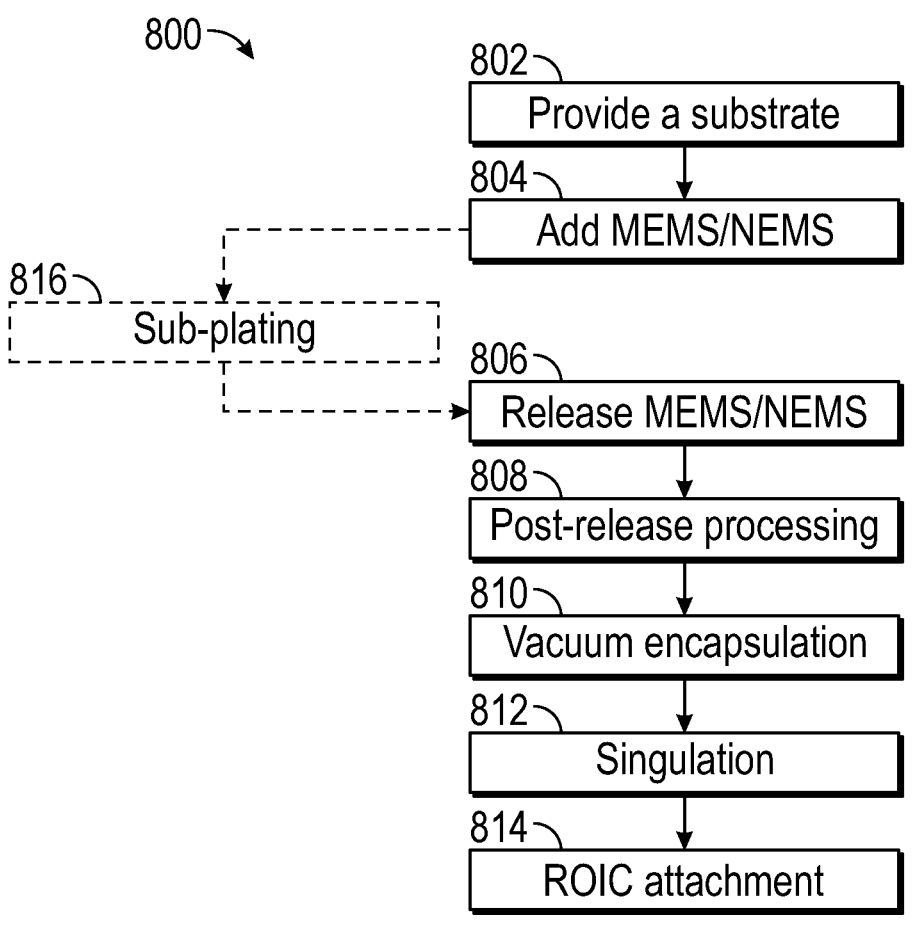
FIG. 8 illustrates a method of manufacturing an electromechanical system, in accordance with an embodiment.
FIG. 9 illustrates an exemplary sensor.

FIG. 8 illustrates a method 800 of manufacturing an electromechanical system, in accordance with an embodiment. As non-limiting examples, the electrochemical system could be associated with the devices (e.g., electromechanical device 200, electromechanical device illustrated in FIGS. 5A-5F, electromechanical device 700) or systems described herein. To manufacture an electromechanical system, all or some of the process steps in method 800 could be used and used in a different order. As a non-limiting example, Step 814 could be performed before Step 812. In some embodiments, the method 300 or method 600 can be performed with method 800.

Method 800 includes Step 802, providing a substrate. In some embodiments, the substrate is made of glass. In some embodiments, the substrate is low temperature polycrystalline silicon. In some embodiments, the substrate is a borosilicate that contains additional elements to fine tune properties. An example of a borosilicate is by Corning Eagle™, which produces an alkaline earth boro aluminosilicate (a silicate loaded with boron, aluminum, and various alkaline earth elements). Other variations are available from Asahi Glass™ or Schott™.

In some embodiments, a flat panel glass process is used to manufacture the electromechanical system. In some embodiments, a liquid crystal display (LCD) process is used to manufacture the electromechanical system. In some embodiments, an OLED display process or an x-ray panel process is used. Employing a flat panel glass process may allow for increased substrate sizes, thereby allowing for a higher number of electrochemical systems per substrate, which reduces processing costs. Substrate sizes for "Panel Level" can include 620 mm×750 mm, 680 mm×880 mm, 1100 mm×1300 mm, 1300 mm×1500 mm, 1500 mm×1850 mm, 1950 mm×2250 mm, and 2200 mm×2500 mm. Further, thin film transistors (TFTs) in panel level manufacturing can also reduce cost and so, for example, LCD-TFT processes can be beneficial.

Method 800 includes Step 804, adding MEMS to the substrate. Although MEMS is used to describe the addition of structures, it should be appreciated that other structures could be added without deviating from the scope of this disclosure. In embodiments using panel level processing, the MEMS structures may be added using an LCD-TFT process.

Step 804 may be followed by optional Step 816, subplating. Step 816 may be used when the substrate is larger than the processing equipment used in subsequent steps. For example, if using a panel level process (such as LCD), some embodiments will include (at Step 804) cutting the panel into wafer sizes to perform further processing (using, for example, CMOS manufacturing equipment). In other embodiments, the same size substrate is used throughout method 800 (i.e., Step 816 is not used).

Method 800 includes Step 806, releasing the MEMS from the substrate.

Method 800 includes Step 808, post-release processing. Such post-release processing may prepare the MEMS structure for further process steps, such as planarization. In wafer-level processing, planarization can include chemical mechanical planarization. In some embodiments, the further process steps include etch back, where a photoresist is spun onto the topography to generate a more planar surface, which is then etched. Higher control of the etch time can yield a smoother surface profile. In some embodiments, the further process steps include "spin on glass," where glass-loaded organic binder is spun onto the topography and the result is baked to drive off organic solvents, leaving behind a surface that is smoother.

Method 800 includes Step 810, vacuum encapsulation of the MEMS structure, where necessary. Vacuum encapsulation may be beneficial to prolong device life.

Method 800 includes Step 812, singulation. Some embodiments may include calibration and chip programming, which may take into account the properties of the sensors. Methods described herein may be advantageous in glass substrate manufacturing processes because uniformity in glass lithography capabilities is limited. As a further advantage, glass has a lower thermal conductivity and so a glass substrate can be a better thermal insulator; by manufacturing thin structures separating a bolometer pixel from a glass substrate, embodiments herein may better serve to thermally isolate the glass bolometer pixel from the packaging environment.

Method 800 includes Step 814, attachment of a readout integrated circuit (ROIC) and flex/PCB attachment. As non-limiting examples, the readout circuits could be associated with devices or systems described herein. Processes and devices described herein may have the further advantage that the area required for signal processing can be much smaller than the sensing area which is dictated by the sensing physics. Typically, sensors are integrated on top of CMOS circuitry, and area driven costs lead to a technology node that is not optimal for the signal processing task. Processes described herein can use a more suitable CMOS and drive down the area required for signal processing, freeing the sensor from any area constraints by leveraging the low cost of FPD (flat panel display) manufacturing. In some embodiments, the ROIC is specifically designed for sensing a specific electromagnetic wavelength (such as X-Rays, THz, LWIR).

FIG. 9 illustrates an exemplary sensor. In some embodiments, sensor 900 is manufactured using method 800. Sensor 900 includes glass substrate 906, structure 904 less than 250 nm wide coupled to glass substrate 906, and a sensor pixel 902 coupled to the structure 904. In some embodiments of sensor 900, structure 904 is a hinge that thermally separates the active area from the glass. In some embodiments, sensor 900 receives an input current or charge and outputs an output current or charge based on the received radiation (e.g., the resistance between two terminals of the sensor changes in response to exposure to LWIR radiation).

In some embodiments, a sensor includes a glass substrate, a structure manufactured from any of the methods described herein and coupled to the glass substrate, and a sensor pixel coupled to the structure.

In some embodiments, a sensor includes a MEMS or NEMS device manufactured by a LCD-TFT manufacturing process and a structure manufactured by any of the methods described herein.

By way of examples, sensors can include resistive sensors and capacitive sensors. Bolometers can be used in a variety of applications. For example, long wave infra-red (LWIR, wavelength of approximately 8-14 μm) bolometers can be used in the automotive and commercial security industries. For example, LWIR bolometers with QVGA, VGA, and other resolution. Terahertz (THz, wavelength of approximately 1.0-0.1 mm) bolometers can be used in security (e.g., airport passenger security screening) and medical (medical imaging). For example, THz bolometers with QVGA resolution and other resolutions. Some electrochemical systems can include X-Ray sensors or camera systems. Similarly, LWIR and THz sensors are used in camera systems. Some electromechanical systems are applied in medical imaging, such as endoscopes and exoscopes. X-ray sensors include direct and indirect sensing configurations.

Other electromechanical systems include scanners for light detection and ranging (LIDAR) systems. For example, optical scanners where spatial properties of a laser beam could be shaped (for, e.g., beam pointing). Electromechanical systems include inertial sensors (e.g., where the input stimulus is linear or angular motion). Some systems may be used in bio sensing and bio therapeutic platforms (e.g., where biochemical agents are detected).

It is understood that the diagrams illustrating devices are for illustrative purposes. It is understood that embodiments of the disclosed invention may not be rectangularly arranged as illustrated. Although the exemplary devices include a specific number of conductive regions, it is understood that the device may include any number of conductive regions.

Although some sections of the disclosed device are illustrated with dashed circles, it is understood that the dashed circles are merely added for clarity and are not meant to be limiting. It is understood that views of other sections of the disclosed device may be substantially similar to the exemplary views.

In one aspect, a method for manufacturing electromechanical systems includes: providing a semiconductor layer having a planar surface; creating conductive regions and adjacent non-conductive regions in the semiconductor layer by modifying a composition of the semiconductor layer, wherein the planar surface comprises surfaces of the conductive regions and the non-conductive regions; and applying a hermetic seal above the planar surface to create a hermetically sealed volume, wherein: a conductive region of the conductive regions comprises a first part and a second part, the first part of the conductive region is below the hermetically sealed volume, and the second part of the conductive region is not below the hermetically sealed volume.

In one aspect of the above method, creating the conductive regions in the semiconductor layer comprises doping regions of the semiconductor layer to create conductive regions.

In some aspects of the above methods, doping the regions of the semiconductor layer further comprises N-type doping the regions.

In some aspects of the above methods, the method further includes P-type doping regions of the semiconductor layer to create the non-conductive regions.

In some aspects of the above methods, the hermetically sealed volume is a vacuum.

In some aspects of the above methods, the conductive regions are created without changing a topography of the semiconductor layer.

In some aspects of the above methods, creating the conductive regions in the semiconductor layer comprises forming a silicide in regions of the semiconductor layer to create conductive regions.

In some aspects of the above methods, forming the silicide further comprises depositing patterned metal on top of the semiconductor layer.

In some aspects of the above methods, a surface of the semiconductor layer spans dimensions greater than 620 mm by 750 mm.

In some aspects of the above methods, the non-conductive regions in the semiconductor layer comprise undoped semiconductor.

In some aspects of the above methods, the conductive regions are created without removing material from the semiconductor layer.

In some aspects of the above methods, the method further includes electrically coupling a via to the conductive region.

In some aspects of the above methods, the method further includes electrically coupling the conductive region to a bolometer circuit.

In some aspects of the above methods, providing a semiconductor layer having the planar surface comprises depositing the semiconductor layer on a glass substrate.

In some aspects of the above methods, the method further includes providing an insulating layer above the semiconductor layer and below the hermetic seal.

In some aspects of the above methods, the method includes oxidizing the non-conductive regions.

In some aspects of the above methods, the method further includes separating the semiconductor layer into a plurality of separated portions, wherein applying the hermetic seal further comprises applying a hermetic seal on top of a separated portion.

In one aspect, an electromechanical system includes: a semiconductor layer having a planar surface, wherein the semiconductor layer comprises conductive regions and adjacent non-conductive regions, wherein the conductive regions comprise a modified material and adjacent non-conductive regions comprise the material, and a hermetic seal applied above the planar surface, wherein the hermetic seal creates a hermetically sealed volume, wherein: a conductive region of the conductive regions comprises a first part and a second part, the first part of the conductive region is below the hermetically sealed volume, and the second part of the conductive region is not below the hermetically sealed volume.

In one aspect of the above system, the conductive regions of the semiconductor layer are doped.

In some aspects of the above systems, the conductive regions comprise N-type dopants.

In some aspects of the above systems, the non-conductive regions comprise P-type dopants.

In some aspects of the above systems, the conductive regions are created without changing a topography of the semiconductor layer.

In some aspects of the above systems, the conductive regions comprise a silicide.

In some aspects of the above systems, the silicide is formed by depositing patterned metal on top of the semiconductor layer.

In some aspects of the above systems, a surface of the semiconductor layer spans dimensions greater than 620 mm by 750 mm.

In some aspects of the above systems, the non-conductive regions in the semiconductor layer comprise undoped semiconductor.

In some aspects of the above systems, the conductive regions are created without removing material from the semiconductor layer.

In some aspects of the above systems, the system further includes a via electrically coupled to the conductive region.

In some aspects of the above systems, at least one of the conductive regions is electrically coupled to a bolometer circuit.

In some aspects of the above systems, the system further includes a glass substrate, wherein the semiconductor layer is deposited on the glass substrate.

In some aspects of the above systems, the system further includes an insulating layer above the semiconductor layer and below the hermetic seal.

In some aspects of the above systems, the non-conductive regions are oxidized.

In some aspects of the above systems, the non-conductive regions are modified differently than the modification of the conductive regions.

In one aspect, a method for manufacturing electromechanical systems, comprises: providing a first semiconductor layer having a first planar surface; creating conductive regions and adjacent non-conductive regions in the first semiconductor layer by modifying a composition of the first semiconductor layer; providing a second semiconductor layer having a second planar surface; creating conductive regions and adjacent non-conductive regions in the second semiconductor layer by modifying a composition of the second semiconductor layer; bonding the first and second semiconductor layers, wherein the second planar surface is parallel to the first planar surface, and electrically coupling the second semiconductor layer to the first semiconductor layer.

In some aspects of the above method, creating the conductive regions in the first and second semiconductor layers comprises doping regions of the semiconductor layers to create conductive regions.

In some aspects of the above methods, doping the regions of the semiconductor layers further comprises N-type doping the regions.

In some aspects of the above methods, the method further comprises P-type doping regions of the semiconductor layers to create the non-conductive regions.

In some aspects of the above methods, the conductive regions are created without changing a topography of the semiconductor layers.

In some aspects of the above methods, creating the conductive regions in the semiconductor layers comprises forming a silicide in regions of the semiconductor layers to create conductive regions.

In some aspects of the above methods, the non-conductive regions in the semiconductor layers comprise undoped semiconductor.

In some aspects of the above methods, the conductive regions are created without removing material from the semiconductor layers.

In some aspects of the above methods, the method further comprises surface treating the first and second planar surfaces.

In some aspects of the above methods, the method further comprises activating the surface-treated planar surfaces prior to bonding the first and second semiconductor layers.

In some aspects of the above methods, electrically coupling the second semiconductor layer to the first semiconductor layer comprises electrically coupling a conductive region of the second semiconductor layer to a conductive region of the first semiconductor layer.

In some aspects of the above methods, the method further comprises electrically coupling a second conductive region of the conductive regions of the first semiconductor layer to a second conductive region of the conductive regions of the second semiconductor layer, wherein the second conductive regions are electrically uncoupled from the first conductive regions.

In some aspects of the above methods, the electrically coupled conductive regions form signal lines.

In some aspects of the above methods, the method further comprises oxidizing the non-conductive regions.

In some aspects of the above methods, the method further comprises separating the bonded semiconductor layers into a plurality of separated portions, each separate portion associated with an electromechanical system.

In some aspects of the above methods, the first and second planar surfaces have a root mean square roughness of less than 1 nm.

In one aspect, an electromechanical system comprises: a first semiconductor layer having a first planar surface, wherein the first semiconductor layer comprises conductive regions and adjacent non-conductive regions, wherein the conductive regions comprise a first modified material and adjacent non-conductive regions comprise the first material; and a second planar semiconductor layer having a second planar surface, wherein the second semiconductor layer comprises conductive regions and adjacent non-conductive regions, wherein the conductive regions comprise a second modified material and adjacent non-conductive regions comprise the second material, wherein: the first planar surface is parallel to the second planar surface, and a conductive region of the first semiconductor layer electrically couples to a conductive region of the second semiconductor layer.

In some aspects of the above system, the conductive regions of the first and second semiconductor layers are doped.

In some aspects of the above systems, the conductive regions comprise N-type dopants.

In some aspects of the above systems, the non-conductive regions comprise P-type dopants.

In some aspects of the above systems, the conductive regions are created without changing a topography of the semiconductor layers.

In some aspects of the above systems, the conductive regions comprise a silicide.

In some aspects of the above systems, the non-conductive regions in the semiconductor layer comprise undoped semiconductor.

In some aspects of the above systems, the conductive regions are created without removing material from the semiconductor layers.

In some aspects of the above systems, the first and second planar semiconductor layers are surface-treated.

In some aspects of the above systems, a conductive region of the second semiconductor layer is electrically coupled to a conductive region of the first semiconductor layer.

In some aspects of the above systems, a second conductive region of the conductive regions of the first semiconductor layer is electrically coupled to a second conductive region of the conductive regions of the second semiconductor layer, and the second conductive regions are electrically uncoupled from the first conductive regions.

In some aspects of the above systems, the electrically coupled conductive regions are signal lines.

In some aspects of the above systems, the non-conductive regions are oxidized.

In some aspects of the above systems, the first and second planar surfaces have a root mean square roughness of less than 1 nm.

In one aspect, a method of manufacturing an electromechanical device, includes: providing a first portion of a device with a bond region; adding features on the surface of the first portion in the bond region; depositing an interfacial layer on the features; positioning a second portion of the device over the bond region; and bonding the first and second portions of the device at the bond region.

In some aspects of the above method, the method includes depositing an insulating layer between the features and the interfacial layer.

In some aspects of the above methods, the first portion includes a non-silicon material.

In some aspects of the above methods, the features include a conductive material.

Although the disclosed embodiments have been fully described with reference to the accompanying drawings, it is to be noted that various changes and modifications will become apparent to those skilled in the art. Such changes and modifications are to be understood as being included within the scope of the disclosed embodiments as defined by the appended claims.

The terminology used in the description of the various described embodiments herein is for the purpose of describing particular embodiments only and is not intended to be limiting. As used in the description of the various described embodiments and the appended claims, the singular forms "a", "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

We claim:

1. A method for manufacturing electromechanical systems, comprising:

providing a semiconductor layer having a planar surface;

forming conductive regions and adjacent non-conductive regions in the semiconductor layer by modifying a composition of the semiconductor layer, wherein the planar surface comprises surfaces of the conductive regions and the non-conductive regions;

applying a hermetic seal above the planar surface to create a hermetically sealed volume, wherein:

a conductive region of the conductive regions comprises a first part disposed below the hermetically sealed volume and a second part disposed outside the hermetically sealed volume; and oxidizing the non-conductive regions, wherein:

the oxidizing is performed after formation of the conductive regions;

the oxidizing selectively converts the non-conductive regions into an electrically insulating oxide;

the electrically insulating oxide is retained to electrically isolate adjacent conductive regions; and the oxidizing is not performed for dopant diffusion or dopant drive-in.

2. The method of claim 1, wherein forming the conductive regions in the semiconductor layer comprises doping regions of the semiconductor layer to form conductive regions.

3. The method of claim 2, wherein doping the regions of the semiconductor layer further comprises N-type doping of the regions.

4. The method of claim 2, further comprising P-type doping of the regions of the semiconductor layer to form the non-conductive regions.

5. The method of claim 1, wherein the hermetically sealed volume is a vacuum.

6. The method of claim 1, wherein the conductive regions are formed without changing a topography of the semiconductor layer.

7. The method of claim 1, wherein forming the conductive regions in the semiconductor layer comprises forming a silicide in regions of the semiconductor layer.

8. The method of claim 7, wherein forming the silicide further comprises depositing patterned metal on top of the semiconductor layer.

9. The method of claim 1, wherein a surface of the semiconductor layer spans dimensions greater than 620 mm by 750 mm.

10. The method of claim 1, wherein the non-conductive regions in the semiconductor layer comprise undoped semiconductor.

11. The method of claim 1, wherein the conductive regions are formed without removing material from the semiconductor layer.

12. The method of claim 1, further comprising electrically coupling a via to the conductive region.

13. The method of claim 1, further comprising electrically coupling the conductive region to a bolometer circuit.

14. The method of claim 1, wherein providing a semiconductor layer having the planar surface comprises depositing the semiconductor layer on a glass substrate.

15. The method of claim 1, further comprising providing an insulating layer above the semiconductor layer and below the hermetic seal.

16. The method of claim 1, further comprising separating the semiconductor layer into a plurality of separated portions, wherein applying the hermetic seal further comprises applying the hermetic seal on top of a separated portion.

17. The method of claim 1, wherein oxidizing the non-conductive regions comprises:

forming an oxide layer on the non-conductive regions of the semiconductor layer while inhibiting oxidation of the conductive regions;

wherein the oxide layer is retained between adjacent conductive regions beneath the hermetic seal to provide electrical isolation; and wherein oxide formed outside the hermetically sealed volume is removed prior to completion of the hermetic seal.

* * * * *